United States Patent
Noda et al.

(10) Patent No.: US 6,285,164 B1
(45) Date of Patent: Sep. 4, 2001

(54) MEANS FOR DETECTING THE INTEGRATED VALUE OF CURRENT FLOW, A MEANS FOR DETECTING THE VALUE OF CURRENT FLOW AND A BATTERY PACK EMPLOYING THOSE MEANS

(75) Inventors: Masaru Noda, Kanagawa-ken; Takashi Takeuchi, Fujisawa; Shinji Tanaka, Ome; Mitsunori Tsuchiya, Yamanashi-ken; Takeshi Yamaguchi, Fuchu, all of (JP)

(73) Assignees: Hitachi, Ltd., Tokyo; Hitachi Maxell, Ltd., Osaka; Hitachi ULSI Systems Co., Ltd., Tokyo, all of (JP)

( * ) Notice: Subject to any disclaimer, the term of this patent is extended or adjusted under 35 U.S.C. 154(b) by 0 days.

(21) Appl. No.: 09/709,431

(22) Filed: Nov. 13, 2000

Related U.S. Application Data

(63) Continuation of application No. 09/275,027, filed on Mar. 24, 1999, now Pat. No. 6,157,170.

(30) Foreign Application Priority Data

Mar. 31, 1998 (JP) .................................................. 10-085483

(51) Int. Cl.[7] ...................................................... H02J 7/00
(52) U.S. Cl. ............................................ 320/132; 320/130
(58) Field of Search .................................... 320/132, 130, 320/134, 136, 152, 156; 324/426, 427, 428

(56) References Cited

U.S. PATENT DOCUMENTS

| | | | |
|---|---|---|---|
| 3,895,284 | 7/1975 | Schweizer et al. ................. | 320/134 |
| 3,912,108 | * 10/1975 | Clayton et al. ..................... | 320/159 |
| 4,153,867 | 5/1979 | Jungfer et al. ...................... | 324/436 |
| 5,841,284 | * 11/1998 | Takahashi ........................... | 320/134 |
| 5,998,971 | * 12/1999 | Corbridge .......................... | 320/132 |
| 6,054,861 | * 4/2000 | Takahashi ........................... | 324/428 |

FOREIGN PATENT DOCUMENTS 6-258410   9/1994   (JP) .

* cited by examiner

*Primary Examiner*—Peter S. Wong
*Assistant Examiner*—Lawrence Luk
(74) *Attorney, Agent, or Firm*—Antonelli, Terry, Stout & Kraus, LLP

(57) ABSTRACT

An apparatus for detecting an integrated value of current flow. The apparatus includes an integrator having an integration capacitor, to which a current sensor voltage is inputted, for outputting an output voltage corresponding to an integrated value of the current sensor voltage, and a resetting circuit for clearing integration electric charges accumulated in the integration capacitor to reset the integrator when the output voltage has reached an upper threshold value or a lower threshold value. The apparatus also includes a counter for counting the number of resets of the integrator in an upper direction or in a lower direction, and a connection-polarity inverting circuit for inverting a polarity of inputting of the current sensor voltage to the integrator, a polarity of connecting of the integration capacitor to the integrator and a counting direction of the counter, alternatively, at a regular time interval and synchronously. An integrated value of current flow is obtained on the basis of a count value of the counter.

5 Claims, 22 Drawing Sheets

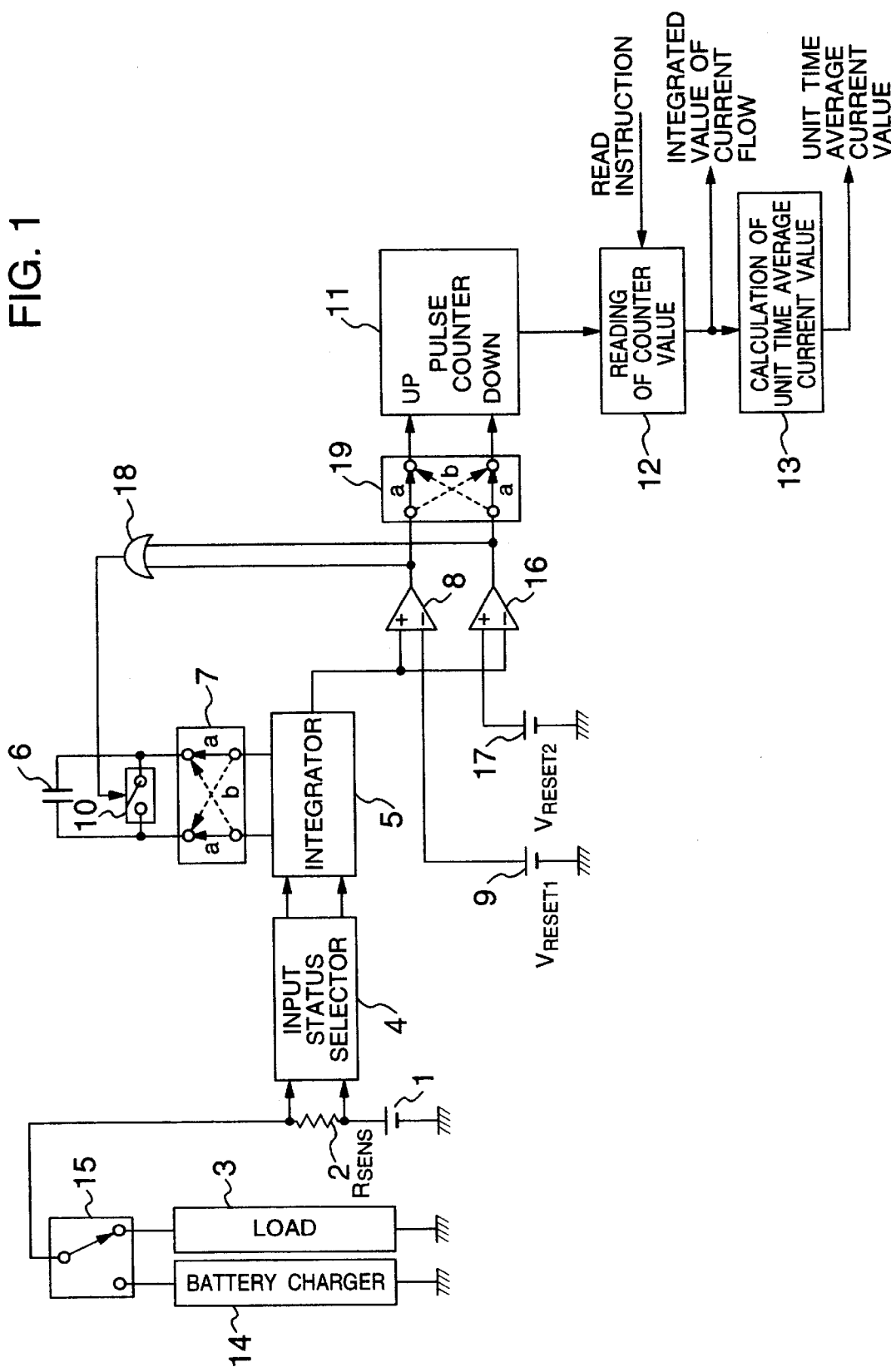

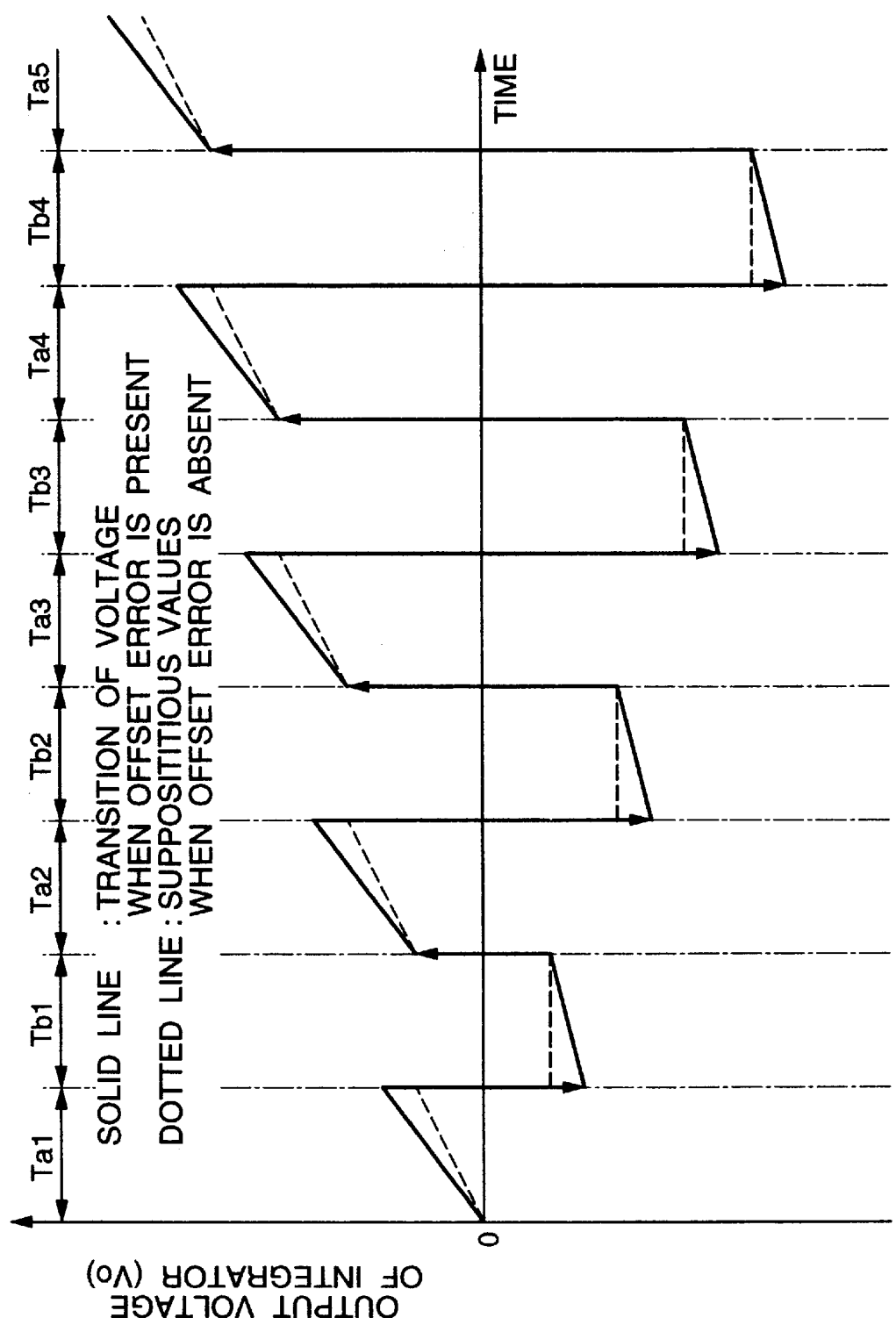

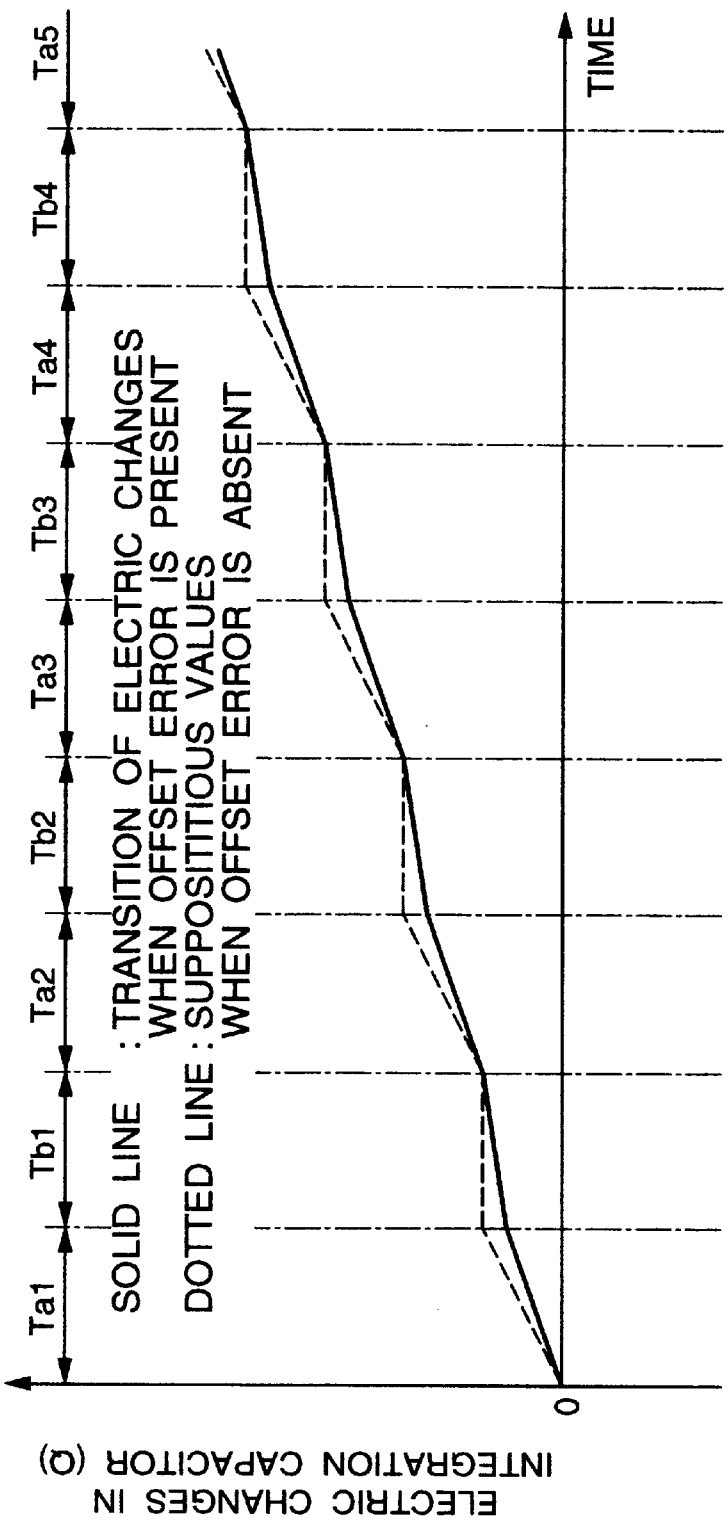

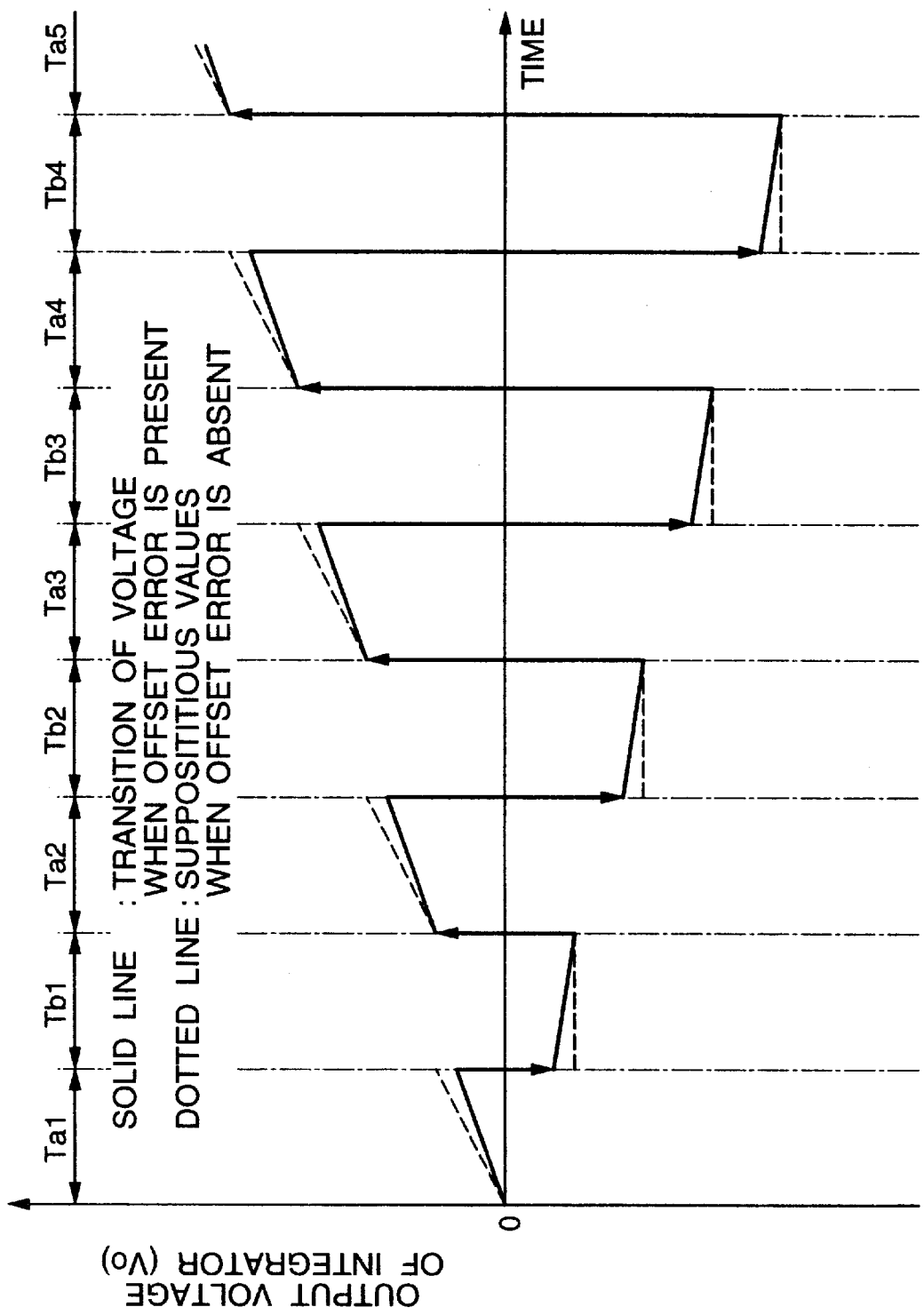

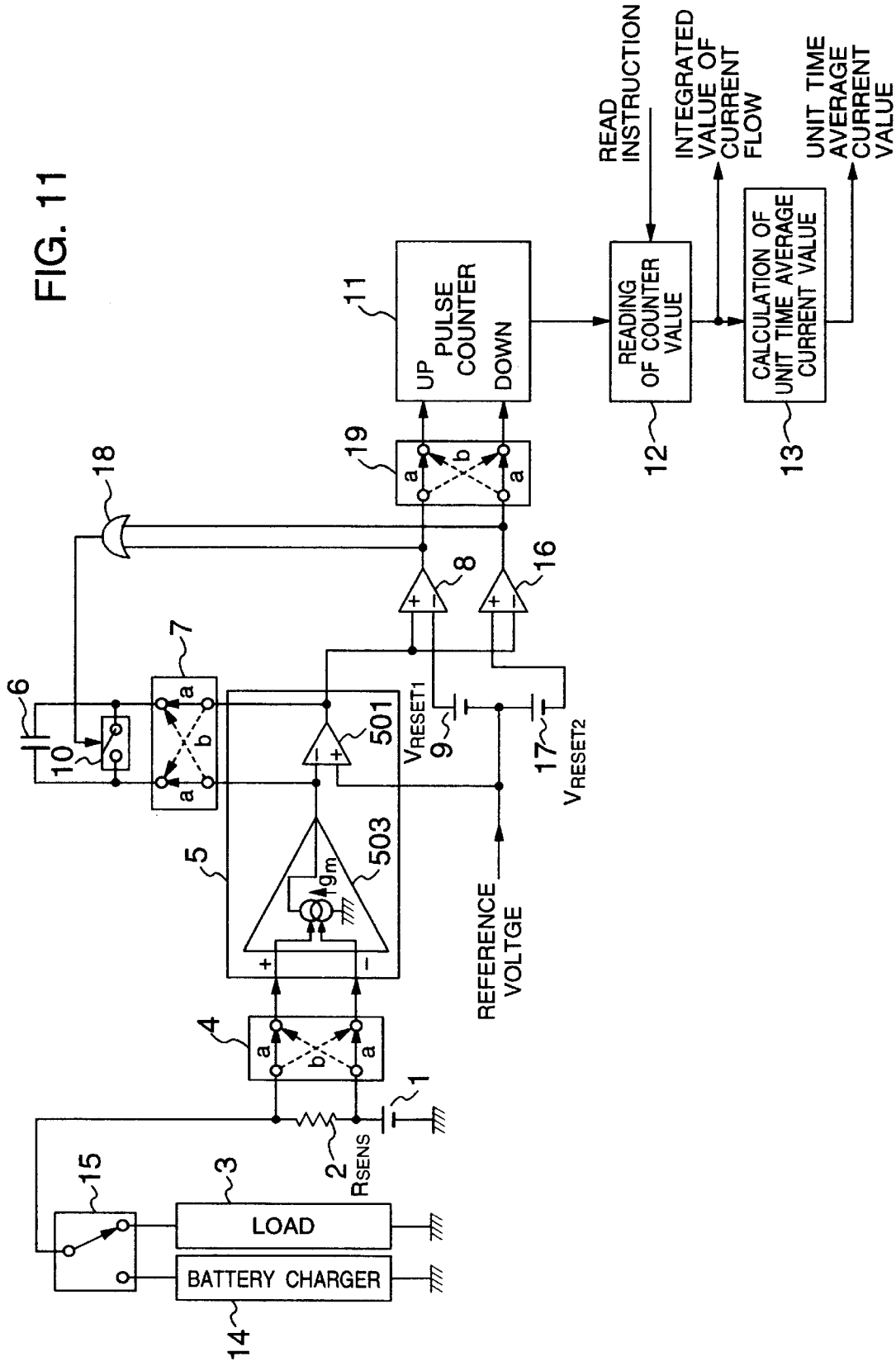

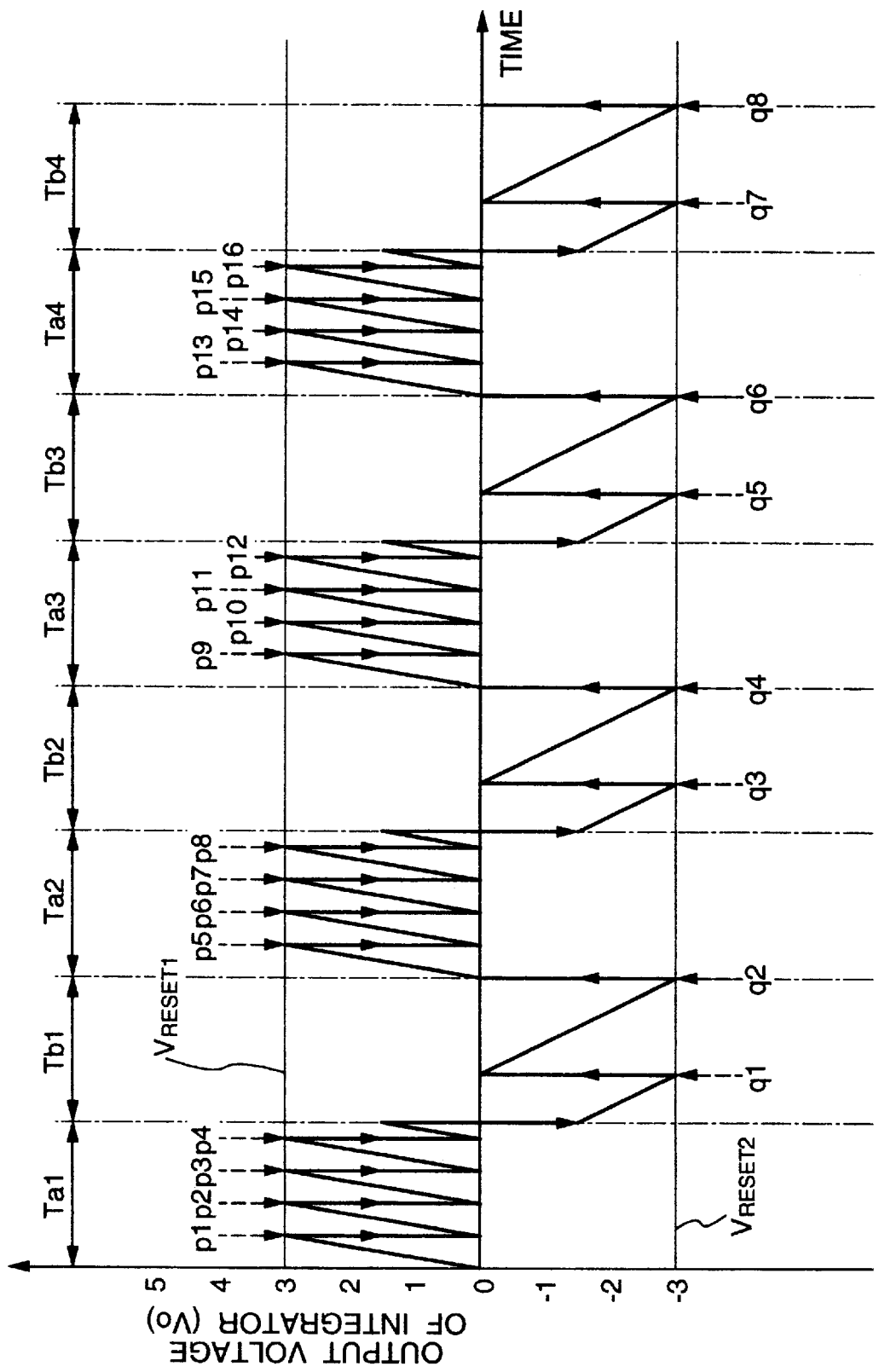

MEANS FOR DETECTING THE INTEGRATED VALUE OF CURRENT FLOW, A MEANS FOR DETECTING THE VALUE OF CURRENT FLOW AND A BATTERY PACK EMPLOYING THOSE MEANS

CROSS REFERENCE TO RELATED APPLICATION

This is a continuation of U.S. application Ser. No. 09/275,027, filed Mar. 24, 1999 now U.S. Pat. No. 6,157,179, the subject matter of which is incorporated by reference herein.

BACKGROUND OF THE INVENTION

1. Field of the Invention

The present invention relates in general to apparatus for detecting the integrated value of current flow, apparatus for detecting the value of current flow and a battery pack employing those apparatus each of which serves to display the data relating to the battery energy remainder of a primary battery or a secondary battery/rechargeable battery for use in portable information terminals and the like, and more particularly to the circuit technology of making each of apparatus for detecting the integrated value of current flow and apparatus for detecting the value of current flow insensitive to the undesired offset of a detection circuits.

2. Description of the Related Art

In a portable information terminal which is typified by a note type personal computer, a user is very anxious about how much battery energy remainder the battery in use has and how long the battery in use can be used. Then, when the battery energy remainder has become equal to or lower than a predetermined value, it is required to take measures to warn a user of this fact and also to back up the data. For this purpose, there is required a method wherein the battery energy remainder of the battery can be aware of as precisely as possible.

Then, heretofore, the method has been proposed in which the charging/discharging current of the battery is monitored at all times to be integrated in order to display the data relating to the battery energy remainder. As for an example thereof, the method disclosed in JP-A-6-258410 is known. In JP-A-6-258410, there is shown the method wherein a resistor for detecting the current flow is inserted in series with a current part of a battery; the voltage which is developed across the resistor is amplified at a predetermined amplification factor; the voltage thus amplified is supplied as a control voltage to a voltage controlled oscillator; and as a result, a pulse oscillation signal having a frequency corresponding to the charging/discharging current value is obtained. In addition, there is also shown the method wherein by counting the number of pluses of the pulse oscillation signal, the integrated value of current flow is obtained.

SUMMARY OF THE INVENTION

The resistance value of the resistor for detecting the value of current flow can not be made excessively large in order to suppress the power loss due to the voltage drop across the resistor as much as possible. In an example of the note type personal computer, the resistance value of that resistor is set to a very small value of about 20 Ωm, and the voltage developed thereacross in the range of about 1 mV to about 100 mV is obtained in correspondence to the load current which changes from several tens mA to a few A. This voltage is supplied as the control voltage either directly or after having been amplified predetermined times to the above-mentioned voltage controlled oscillator. On the other hand, normally, for an operational amplifier for use in the amplification or an operational amplifier for use in configuration of a voltage controlled oscillator, it can not be avoided to involve the offset of about ±5 mV due to the dispersion in manufacture of semiconductor devices and other causes. Then, for the above-mentioned control voltage of about 1 mv to about 100 mV, the bad influence provided by the offset will become so large as not to be able to be disregarded. By the way, in the case where the resistance value of the resistor for detecting the value of current flow is 20 mΩ as described above, the offset of 5 mV corresponds to 250 mA in current detection error.

The influence of the current detection error due to the offset is further increased when obtaining the integrated value of current flow. For example, actually, in the case as well where the load current is zero, the load current may be recognized by mistake as if the current of 250 mA is continuously consumed, and hence the load current may exhibit as the integrated value the large value in some cases.

In this connection, while the main cause of generating the offset is the unbalance in threshold voltage of a pair of differential transistors at the first stage constituting the operational amplifier, in addition thereto, the main cause may be various every circuit configuration method.

The theme of the present invention is therefore to provide apparatus for detecting the value of current flow and apparatus for detecting the integrated value of current flow each of which becomes insensitive to the offset of those operational amplifiers and the like.

In order to solve the above-mentioned problems associated with the prior art, each of apparatus for detecting the integrated value of current flow, apparatus for detecting the value of current flow and a battery pack employing those apparatus according to the present invention includes: a current sensor resistor which is inserted in series with a current path of a battery; an integrator; an input status selector through which a voltage developed across the current sensor resistor is introduced into an input of an integrator; an integration capacitor connected to the integrator; a connection-polarity inverter for the integration capacitor provided between the integrator and the integration capacitor for switching the connection-polarity of the integration capacitor; a first voltage comparator for outputting, when an output voltage of the integrator changing with the transition of time has reached a first predetermined threshold voltage for integration reset which is located on the plus side with respect to the output voltage, as the reference voltage, of the integrator which is obtained by clearing the electric charges of the integration capacitor, a voltage transition exhibiting that fact; a second voltage comparator for outputting, when the output voltage of the integrator has reached a second predetermined threshold voltage for integration reset which is located on the minus side with respect to the reference voltage, a voltage transition exhibiting that fact; integration resetting means for clearing the accumulated electric charges in the integration capacitor when the first or second voltage comparator outputs the voltage transition; a pulse counter for up-counting, of pulses generated at an output of the first or second voltage comparator at operation frequency of the integration resetting means, the output pulses of one voltage comparator and for down-counting the output pulses of the other voltage comparator; and a up/down inverter for inverting the up/down count input to the pulse counter.

The input status selector switches regularly, alternately two statuses of a status a and a status b, and in the status a, introduces a battery current sensor voltage developed across terminals of the current sensor resistor into the integrator. On the other hand, in the status b, the input status selector either inverts the polarity of the battery current sensor voltage developed across the terminals of the current sensor resistor to introduce the resultant voltage into the integrator, or introduces the voltage of zero into the input of the integrator. More specifically, the voltage at one of the terminals of the current sensor resistor is introduced into a pair of input terminals of the integrator.

The connection-polarity inverter of the integration capacitor switches alternately the connection polarity of the integration capacitor synchronously with the status a and the status b of the input status selector.

Then, the integrator time-integrates, during a time period of the status a, the current corresponding to the battery current together with the current due to the above-mentioned undesirable offset to accumulate the resultant electric charges as the integration electric charges in the integration capacitor, while in the status b, time-integrates the current which is obtained by inverting the current corresponding to the battery current together with the current due to the above-mentioned undesirable offset, or time-integrates only the current due to the offset to accumulate the resultant electric charges as the integration electric charges in the integration capacitor. However, the connection-polarity of the integration capacitor is inverted in correspondence to the status a and the status b by the connection-polarity inverter of the integration capacitor. As a result, with respect to the component of the current due to the abovementioned offset, the integration electric charges in the status a and the integration electric charges in the status b subtract from each other. Both of the mechanism of generating the offset and the offset amount are basically invariable between the status a and the status b. Then, the time period of the status a and the time period of the status b are equally taken, whereby the integration electric charges of the current due to the above-mentioned offset are perfectly canceled. On the other hand, with respect to the component of the battery current, in the case where in the status b, both of the polarities of the battery current sensor voltage at the input of the integrator and the integration capacitor are inverted, the integration electric charges which are accumulated in the integration capacitor during the time period of the status b are added at the same polarity as that in the status a, while in the case where in the status b, the voltage at the input of the integrator is made zero, only the integration electric charges of the component of the battery current during the time period of the status a are accumulated in the integration capacitor.

As a result, the voltage corresponding to the time-integration value of the battery current which is not influenced by the offset at all can be obtained at the output of the integrator. This voltage changes with the transition of time and when this voltage has reached the first or second threshold voltage for integration reset, the first or second voltage comparator outputs the voltage transition exhibiting that fact and at the same time, the integration resetting means is turned on so that within a very short time period, the integration electric charges accumulated in the integration capacitor are perfectly cleared. By clearing the integration electric charges in such a way, the output voltage of the integrator is immediately returned back to the initial voltage, and the output voltage of the associated voltage comparator is also immediately returned back to the original voltage to turn off the integration resetting means. Subsequently, the operation proceeds to the next cycle of the battery current integration.

Along with the progress of the series of operations, every integration resetting, one pulse is generated at the output of the first or second voltage comparator. The pulses which have been generated at the output of the first voltage comparator during the time period of the status a of the input status selector is up-counted by the pulse counter, and similarly, the pulses which have been generated at the output of the second voltage comparator during the time period of the status a is down-counted. On the other hand, during the time period of the status b, the up-counting and the down-counting are inversely combined. The above-mentioned up/down inverter operates synchronously with the switching of the input status selector to carry out the up/down inversion.

The integrated value of the battery current for a time period ranging from a certain integration reset to the next integration reset depends on the battery current and the design items such as the resistance value of the current sensor resistor, the gain of the integrator, the capacitance value of the integration capacitor, and the predetermined threshold voltage for integration reset. Because these design items can be fixed, the integrated value of the battery current over a long time period can be obtained in the form of the digital value by counting the number of pulses. In addition, by measuring the number of pulses which are generated within a unit time (i.e., the frequency), the battery current value at the time of interest can be obtained.

BRIEF DESCRIPTION OF THE DRAWINGS

These and other objects, features and advantages of the present invention will become more readily apparent from the following detailed description when taken in conjunction with the accompanying drawings, wherein:

FIG. 1 is a block diagram, partly in circuit diagram, showing a configuration of a first embodiment of the present invention;

FIGS. 4A and 4B are respectively diagrams showing waveforms of an integration capacitor and an integrator when the offset is the same in polarity as the battery current sensor voltage;

FIGS. 5A and 5B are respectively diagrams showing waveforms of an integration capacitor and an integrator when the offset is opposite in polarity to the battery current sensor voltage;

FIG. 11 is a block diagram, partly in circuit diagram, showing a configuration of a second embodiment of the present invention;

FIGS. 13A and 13B are respectively diagrams showing waveforms of an integrator;

DETAILED DESCRIPTION OF THE PREFERRED EMBODIMENTS

Figure 2A:
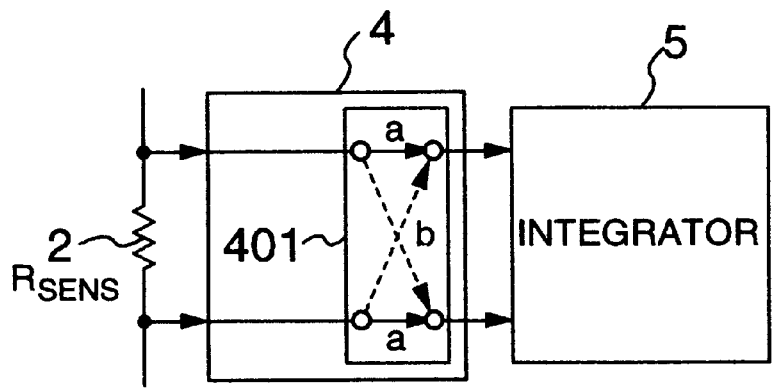
FIGS. 2A, 2B and 2C are respectively block diagrams, partly in circuit diagrams, showing concrete configurations of examples of an input status selector.

The preferred embodiments of the present invention will hereinafter be described in detail with reference to the accompanying drawings.

FIG. 1 is a block diagram, partly in circuit diagram, showing a configuration of a first embodiment of the present invention. In the figure, reference numeral 1 designates a battery; reference numeral 2 designates a current sensor resistor; reference numeral 3 designates a load; reference numeral 4 designates an input status selector; reference numeral 5 designates an integrator; reference numeral 6 designates an integration capacitor; reference numeral 7 designates a connection-polarity inverter of the integration capacitor; reference numeral 8 designates a first voltage comparator; reference numeral 9 designates a first threshold voltage for integration reset; reference numeral,10 designates integration resetting means; reference numeral 11, a pulse counter; reference numeral 12, counter value reading means; reference numeral 13, means for calculating an average current value per unit time; reference numeral 14, a battery charger; reference numeral 15, a charge/discharge switching unit; reference numeral 16, a second voltage comparator; reference numeral 17, a second threshold voltage for integration reset; reference numeral 18, an OR gate; and 19, a up/down inverter. In this connection, as for the method of realizing the integration resetting means 10, while there may be conceivable a plurality of methods as will be described later, in the first embodiment, the integration resetting means is typified in the form of a reset switch as shown in the figure, and is represented by the integration resetting means 10.

The battery 1 may be either a single cell or a plurality of cells which are piled up in series. In addition, the battery 1 may be a primary battery, or a secondary battery/rechargeable battery.

The current sensor resistor 2 is the resistor having a resistance value ($R_{SENS}$) of about 20 mΩ which is inserted in series between the battery 1 and the load 3 and across terminals of which the sensor voltage (Vs) equal to the product of the resistance value of about 20 mΩ and a value (Is) of a battery current which is either supplied from the battery 1 to the load 3 or supplied from the battery charger 14 to the battery 1 is developed.

The input status selector 4 introduces the sensor voltage (Vs) which is developed across the terminals of the current sensor resistor 2 into an input of the integrator 5 and switches regularly, alternately a status a and a status b. In the status a, the input status selector 4 introduces the sensor voltage (Vs) which is being developed across the terminals of the current sensor resistor 2 into the input of the integrator 5, while in the status b, inverts the polarity of the sensor voltage to introduce the resultant voltage into the input of the integrator 5, or provides the status of supposing that the battery current value (Is) is zero, i.e., the connection status in which the sensor voltage (Vs) becomes substantially equal to zero irrespective of the actual battery current value Is to introduce the resultant voltage relating thereto into the input of the integrator 5.

Figure 2B:
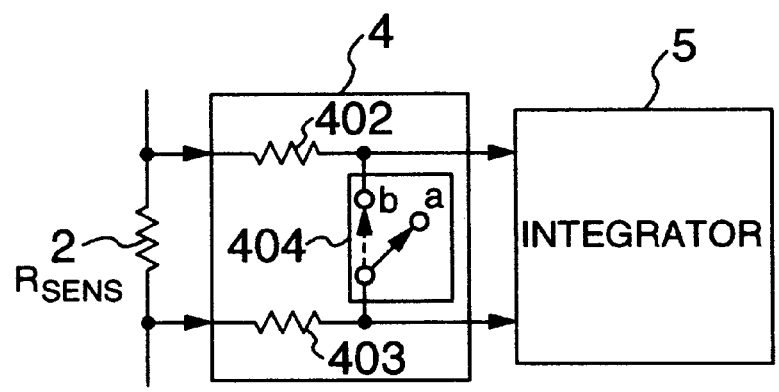
Figure 2C:
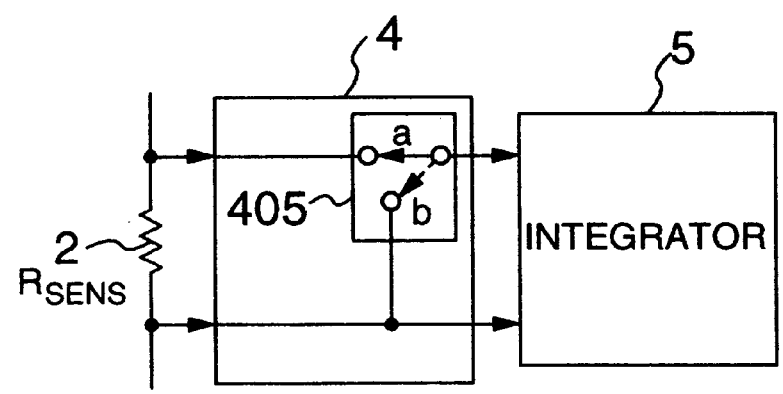

Examples of concrete configurations of the above-mentioned input status selector 4 are shown in FIGS. 2A, 2C, respectively. In the figures, reference numeral 401 designates a polarity inverting switch, reference numerals 402 and 403 designate resistors, respectively, and reference numerals 404 and 405 designate switches, respectively, and other reference numerals are the same as those in FIG. 1.

First of all, the operation of the example of the configuration shown in FIG. 2A will hereinbelow be described. The polarity inverting switch 401 operates so as to switch the two input lines for the status a and the status b, whereby in the status b, the sensor voltage (Vs) is inverted in polarity to be inputted across the input terminals of the integrator 5.

Next, the operation of the example of the configuration shown in FIG. 2B will hereinbelow be described. In the status a, the switch 404 is switched to a position a to be in the off status, and the sensor voltage (Vs) developed across the terminals of the current sensor resistor 2 is introduced into the integrator 5 through the resistors 402 and 403. on the other hand, in the status b, the switch 404 is switched to a position b to be in the on status, and hence the middle of the path through which the sensor voltage (Vs) developed across the terminals of the current sensor resistor 2 is introduced into the integrator 5 is short-circuited. As a result, the sensor voltage (Vs) which is introduced into the integrator 5 becomes substantially equal to zero irrespective of the battery current value (Is) and hence the connection status of supposing that the battery current value (Is) is zero can be obtained. In this connection, each of the resistors 402 and 403 is provided in order to avoid the problem that the short-circuit by the switch 404 becomes imperfect since the current sensor resistor 2 has the low resistance value of about 20 mΩ, and hence may be neglected in principle.

Next, the operation of the example of the configuration shown in FIG. 2C will hereinbelow be described. In the status a, the switch 405 is switched to a position a, and hence the sensor voltage (Vs) developed across the terminals of the current sensor resistor 2 is introduced into the integrator 5. On the other hand, in the status b, the switch 405 is switched to a position b and hence the voltage which is introduced across the input terminals of the integrator 5 in this status b is not the sensor voltage developed across the terminals of the current sensor resistor 2, but the voltage at one of the terminals of the current sensor resistor 2. In such a way, the fact that the voltage at one of the terminals of the current sensor resistor 2 is introduced into a pair of input terminals of the integrator 5 is substantially equal to that in the status a, the resistance value ($R_{SENS}$) of the current sensor resistor 2 is made zero. Therefore, there can be obtained the connection-status in which it is supposed that the battery current value (Is) is zero irrespective of the actual battery current value (Is).

Referring back to FIG. 1 again, the integrator 5 receives the sensor voltage (Vs), which has been developed across the terminals of the current sensor resistor 2, at its input terminals through the input status selector 4 and then generates across its output terminals the voltage corresponding to the value which has been obtained by time-integrating the voltage developed across the input terminals.

Figure 3A:
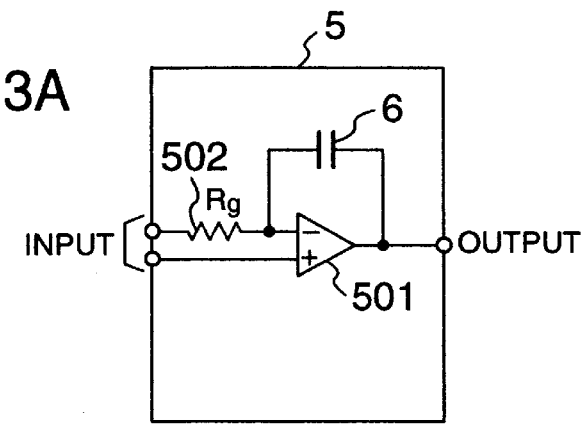
FIGS. 3A, 3B and 3C are respectively circuit diagrams showing concrete configurations of examples of an integrator.
Figure 3B:
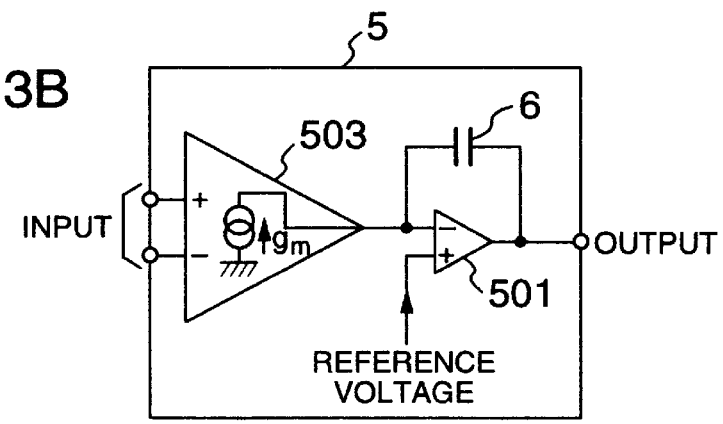
Figure 3C:
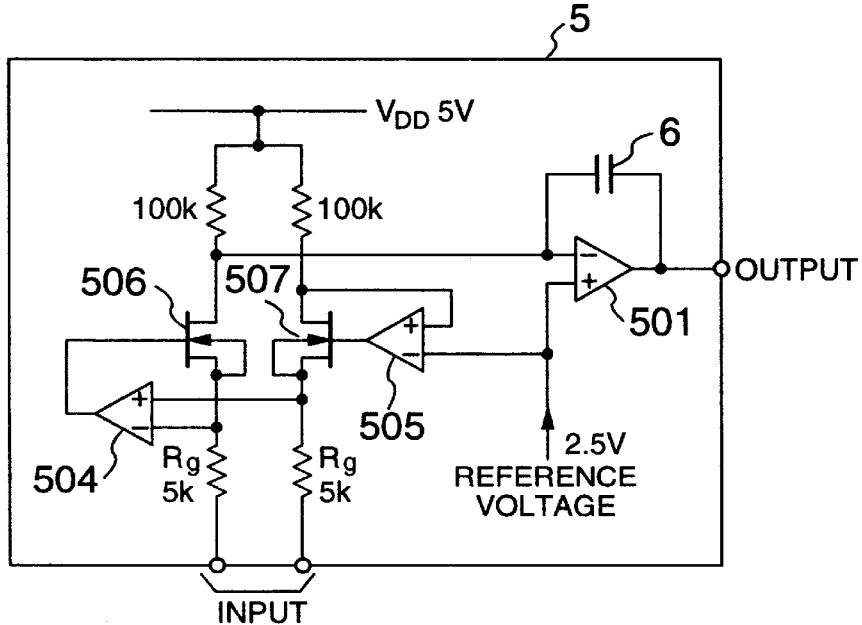

Examples of concrete configurations of the above-mentioned integrator are shown in FIG. 3A, 3B and 3C, respectively. In the figures, reference numeral 501 designates an operational amplifier, reference numeral 502 designates a resistor, and reference numeral 6 designates an integration capacitor. In this connection, while in FIG. 1, the integration capacitor 6 is illustrated so as to be separated from the integrator 5, the function of the integration capacitor 5 shown in the figures is the same as that of the integration capacitor 5 shown in FIG. 1.

First of all, the integrator illustrated in FIG. 3A is well known as the integrator employing an operational amplifier. In this circuit, the integration capacitor 6 constitutes the negative feed back path extending from one output terminal of the operational amplifier 501 to one input terminal of the negative polarity so that when viewed from the outside the input terminals of the operational amplifier, very low input impedance is observed there. And the input terminals can be regarded as in the supposititious short-circuit status. Therefore, when the voltage is applied to the integrator 5, the current the value of which is obtained by dividing that applied voltage by the resistance value (Rg) of the resistor 502 flows into the integration capacitor 6 through the resistor 502, and then the electric charges equal to the integrated value of current flow are accumulated in the integration capacitor 6. As a result, when the input voltage is Vs, the resistance value of the resistor 502 is Rg, and the capacitance value of the integration capacitor 6 is C, the accumulated electric charges (Q) in the integration capacitor and the output voltage (Vo) of the integrator 5 are respectively expressed by the following equations.

$$Q=\int (V_s/R_g)dt$$
$$V_o=-(1/C)\int (V_s/R_g)dt \quad (1)$$

As expressed by the above equations, the voltage corresponding to the time integration value of the output voltage is obtained across the output terminals.

Then, normally, the operational amplifier constituting this integrator is accompanied with an offset error more or less. The offset error is expressed by Vd, the equivalent input offset voltage, which is defined so that Vd applied to the positive polarity input terminal of the ideal operational amplifier which is free from the offset error causes the same offset error that of the actual operational amplifier. In this case, the accumulated electric charges (Q) of the integration capacitor 6 and the output voltage (Vo) of the integrator 5 are respectively expressed as follows in correspondence to Expression (1).

$$Q=\int (_{(vs/vd)}/R_s)dt$$
$$V_o=-(1/C)\int ((V_s-V_d)/R_g)dt \quad (2)$$

Next, the integrator illustrated in FIG. 3B will hereinbelow be described. In the figure, reference numeral 503 designates a voltage-to-current conversion amplifier which outputs a current proportional to the input voltage. While this is mentioned by the mutual conductance (gm) in the electronic circuits as the concrete examples, the current output type differential amplifier constituted by the differential transistor pair, and the like may be taken a s the concrete examples thereof. The operation of the operational amplifier 501 and the integration capacitor 6 is the same as that shown in FIG. 3A as has already been described. Thus, the output current from the voltage-to-current conversion amplifier 503 flows into the integration capacitor 6, which is provided so as to constitute the negative feed back path extending from one output terminal of the operational amplifier 501 to the negative polarity input terminal thereof, to be accumulated therein in the form of the electric charges equal to the integrated value of that current. As a result, the accumulated electric charges (Q) of the integration capacitor 6 and the output voltage (Vo) are respectively expressed by the following equations.

$$Q=\int (V_s \cdot g_m)dt$$
$$V_o=-(1/C)\int (V_s \cdot g_m)dt \quad (3)$$

As expressed by Expression (3), the voltage can be obtained which corresponds to the time integration value of the input voltage to the voltage-to-current conversion amplifier 503. In the same manner as described above, the accumulated electric charges (Q) in the integration capacitor 6 and the output voltage (Vo) of the integrator 5 when the equivalent input offset voltage of the voltage-to-current conversion amplifier 503 is Vd are expressed as follows in correspondence to Expression (3).

$$Q=\int ((V_s+V_d) \cdot g_m)dt$$
$$V_o=-(1/C)\int ((V_s+V_d) \cdot g_m)dt \quad (4)$$

Next, the integrator illustrated in FIG. 3C will hereinbelow be described. In the figure, reference numerals 504 and 505 designate operational amplifiers, respectively, and reference numerals 506 and 507 designate FETS, respectively. The present circuit operates in such a way that the d.c. voltage on the input terminal side is the low voltage near 0V, and the operation reference voltage of the integrator is the middle voltage (2.5 V). A gate of the FET 507 is controlled by the operational amplifier 505, and the current value is determined in such a way that the voltage of a drain (on a resistor with 100 kΩ side) matches the reference voltage (2.5 V). On the other hand, a gate of the FET 506 is controlled by the operational amplifier 504, and the current value is determined in such a way that the voltage of a source (on a resistor with 5 kΩ side) matches the voltage of a source of the FET 507. Now, if the input voltage is applied across the input terminals, then the current flowing through the FET 506 is controlled in order to make the voltages of the sources of both of the FETs 506 and 507 match each other, and as a result the change in the current corresponding to the value which is obtained by dividing the input voltage by Rg occurs which current is supplied from the drain of the FET 506 to the inverted input terminal of the operational amplifier 501. In this connection, the integration operation of the operational amplifier 501 is the same as that of the abovementioned example.

Referring back to FIG. 1 again, while the integration capacitor 6 shown in FIG. 1 is, as has already been described, one constituent element of the integrator 5, in order to demonstrate clearly the relation between the integration capacitor 6 and the connection-polarity inverter 7 of the integration capacitor, as shown in the figure, the integration capacitor 6 is illustrated so as to be provided outside the integrator 5.

The connection-polarity inverter 7 of the integration capacitor inverts the connection-polarity of the integration capacitor 6 synchronously with the status switching made by the above-mentioned input status selector 4.

For the time being, the description will hereinbelow be given with respect to the operation of the portion which is constituted by the above-mentioned constituent elements 1 to 7.

The description will now be given with respect to the specific case where the input status selector 4 has the configuration shown in FIG. 2C and the integrator 5 has the configuration shown in FIG. 3A. When the direction of the current which is caused to flow through the path extending from the battery 1 towards the load 3 is defined to be positive and this current is designated by (Is), and also the voltage (Vs) which is developed across the terminals of the current sensor resistor 2 is defined with the terminal on the battery 1 side as the reference, the following relation is obtained.

$$V_s = -R_{SENS} \cdot I_s \quad (5)$$

Now, let us consider a time period (Ta) when the input status selector 4 is in the status a (indicated by a solid line arrow in the figure) and the connection-polarity inverter 7 of the integration capacitor is also in the status a (indicated by solid line arrows in the figure) synchronously therewith. Then, the sensor voltage (Vs) expressed by Expression (5) is introduced into the integrator 5 having the configuration shown in FIG. 3A and the integrator 5 causes the current the value of which is obtained by dividing the sensor voltage (Vs) by Rg to flow into the integration capacitor 6 in which the electric charges equal to the integrated value of the current of interest are accumulated. Then, the voltage developed across the output terminals of the integrator 5 changes with the transition of the accumulation of the electric charges, and the amount of voltage change corresponds to the integrated value of the sensor voltage (Vs).

In addition, since the operational amplifier 501 as the constituent element of the integrator has the equivalent input offset voltage Vd, the electric charges corresponding to the integrated value of the equivalent input offset voltage Vd are accumulated, together with the above-mentioned electric charges, in the integration capacitor 6, and the voltage change due thereto is added to the amount of voltage change which is generated at the output terminals.

Next, let us consider a time period (Tb) after the input status selector 4 has made the transition to the status b (indicated by a dotted line arrow in the figure) and the connection-polarity inverter 7 of the integration capacitor also makes the transition to the status b (indicated by dotted line arrows in the figure) synchronously therewith. Since the input status switch 4 is in the status b, the sensor voltage (Vs) is not introduced into the integrator 5, and instead the voltage of zero is inputted to the integrator 5. As a result, the integrator 5 integrates only the equivalent input offset voltage (Vd) of the operational amplifier 501 as the constituent element of the integrator 5. However, since in the status b, the connection of the integration capacitor is inverted by the connection-polarity inverter of the integration capacitor, during the time period (Tb) of the status b, the integration capacitor 6 accumulates therein the electric charges in such a way as to subtract the electric charges equal to the integrated value of current flow, the value of which is obtained by dividing the equivalent input offset voltage (Vd) by Rg, from the accumulated electric charges, as the initial value, which were accumulated at the last time of the time period (Ta) of the previous status a. Incidentally, more strictly expressing, "the electric charges which are obtained by inverting the polarity of the accumulated electric charges which were accumulated at the last time of the time period (Ta) of the previous status a are treated as the initial value, and under this condition, during the time period (Tb) of the status b, the integration capacitor 6 accumulates therein the electric charges in such a way as to add the electric charges equal to the integrated value of current flow, the value of which is obtained by dividing the equivalent input offset voltage (Vd) by Rg, to the initial value". But, the important points are that the accumulated electric charges for the offset error in the time period (Tb) of the status b are opposite in polarity to the accumulated electric charges for the offset error in the time period (Ta) of the status a and that the value which is intended to be finally obtained is the total sum of the integrated value in the time period (Ta) of the status a. Therefore, it is suitable to make the expression with the polarity of the accumulated electric charges during the time period in the status a as the reference as described above.

As a result, the electric charges which are accumulated in the integration capacitor 6 at a time right after the time period (Tb) of the status b has elapsed and the transition is made to the next status a are obtained by subtracting the electric charges corresponding to the integrated value of the equivalent input offset voltage (vd) which electric charges are accumulated during the time period (Tb) of the status b from the electric charges corresponding to the value which is obtained by adding the integrated value of the equivalent input offset voltage (Vd) to the integrated value of the sensor voltage (Vs) which electric charges were accumulated during the time period (Ta) of the initial status a. In this connection, by setting the time period (Ta) of the status a and the time period (Tb) of the status b equal to each other, the influence of the equivalent input offset voltage (Vd) can be canceled perfectly to accumulate only the electric charges corresponding to the integrated value of the sensor voltage (Vs) in the integration capacitor 6. Along therewith, in the voltage as well which is developed across the output terminals of the integrator 4, the influence of the equivalent input offset voltage (Vd) is removed perfectly therefrom.

By repeating alternately the time period (Ta) of the status a and the time period (Tb) of the status b, the integration of the sensor voltage (Vs), i.e., the integration of the battery current can be continued while removing the influence of the equivalent input offset voltage (Vd). Of course, while the time period when the battery current is integrated is the time period ($\Sigma$Ta) which is obtained by adding up the time periods (Ta) of the status a, and hence is a half the total time, the conversion thereof is sufficient only by doubling the integration value. With respect to this fact, it can be proved from the sampling theory that for the charge period of the battery current, the cycle of the time period (Ta) of the status a has only to be made equal to or lower than a half. In addition, in the normal case, the change in the battery current is slow, and hence it is unusual that this fact becomes a problem.

The offset error cancelling mechanism will be described, by way of Expressions, as follows.

Assuming that the time periods of the status a are, in the order of repetition, Ta1, Ta2, Ta3, . . . , TaN, the time periods of the status b are, in the order of repetition, Tb1, Tb2, Tb3, . . . , TbN, the accumulated electric charges of the respective time periods are Qa1, Qa2, Qa3, . . . , QaN, and Qb1, Qb2, Qb3, . . . , QbN, and the amounts of change in the output voltage of the integrator of the respective time periods are Voa1, Voa2, Voa3, VoaN, and Vob1, Vob2, Vob3, . . . , VobN, the following equations are established.

$$Q_{aN} = \int_{TaN}(R_{SENS} \cdot I_s / R_g) dt + \int_{TaN}(V_d / R_g) dt$$

$$Q_{bN} = -\int_{TbN}(V_d / R_g) dt$$

$$V_{OaN} = (1/C) \int_{TaN}(R_{SENS} \cdot I_s / R_g) dt + (1/C) \int_{TdN}(V_d / R_g) dt$$

$$V_{ObN} = -\int_{TbN}(V_d / R_g) dt$$

$$\Sigma(Q_{aN} + Q_{bN}) = \int_{Ta}(R_{SENS} \cdot I_s / R_g) dt$$

$$\Sigma(V_{OaN} + V_{ObN}) = (1/C) \int_{Ta}(R_{SENS} \cdot I_s / R_g) dt \quad (6)$$

In the above Expressions, TaN or TbN which is added to the bottom right of the integration mark $\int$ means that the input status selector is in the N-th status a or the N-th status b, and the integration periods thereof are respectively TaN or TbN. In addition, Ta which is added to the bottom right of the integration mark ∫ means that all of the time periods of the status a are integrated. This is also applied to the marks which are added to the bottom right of Q and Vo.

Each of the first terms of the right sides of the first equation and the third equation in Expression (6) corresponds to the integration value of the battery current sensor voltage, and each of the second terms thereof corresponds to the integration voltage of the offset error of the integrator. The fifth equation of Expression (6) means that if the total sum of accumulated electric charges of the status a and accumulated electric charges of the status b is obtained, then the value corresponding to the integration value of the battery current in which the influence of the offset error is removed can be obtained. Similarly, the sixth equation means that if the total sum of the change in the integrator output voltage of the status a and the change in the integration output voltage of the status b is obtained, then the voltage corresponding to the integration value of the battery current in which the influence of the offset error is removed can be obtained.

Figure 4A:
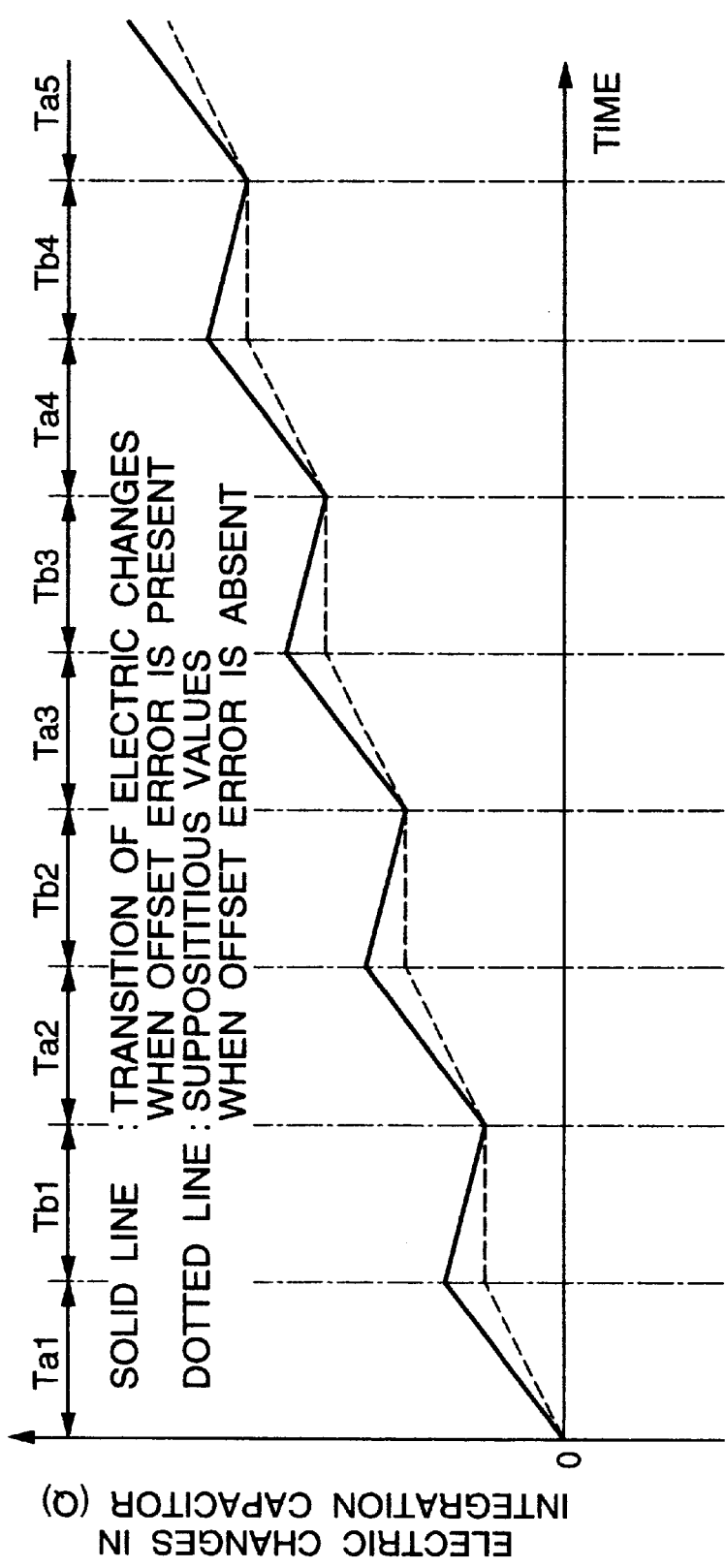

Next, the operation as described above will hereinbelow be described with respect to waveform charts. FIG. 4A is a waveform chart showing the transition of the electric charges accumulated in the integration capacitor, and FIG. 4B is a waveform chart showing the transition of the output voltage of the integrator.

In FIG. 4A, a dotted line represents the transition of the electric charges when supposing the case where the offset error is absent, while a solid line represents the transition of the electric charges when the offset error is present which has the same polarity as that of the sensor voltage of the battery current and is half in magnitude thereof. During a time period (Ta1) of the status a, the component of the sensor voltage is integrated together with the offset component, and hence the solid line makes the transition with gradient which is 1.5 times as large as that of the dotted line. During the subsequent time period (Tb1) of the status b, only the component of the offset error is integrated to be accumulated in the integration capacitor with the reverse polarity, and hence the electric charges are the more reduced and at the last time of Tb1, match the electric charges when supposing the case where the offset error indicated by the dotted line is absent. That is, for the electric charges accumulated in the integration capacitor when viewing over the time period Ta1 and the time period Tb1, the influence of the offset error is removed, and the electric charges can be obtained which is obtained by integrating only the sensor voltage of the battery current. This is applied to the next time periods Ta2 and Tb2 and the time periods after the time periods Ta2 and Tb2, and hence the electric charges corresponding to the value which is obtained by integrating only the sensor voltage of the battery current which is free from the influence of the offset error are added successively.

FIG. 4B illustrates the transition of the output voltage of the integrator in the same case as that of FIG. 4A. The origin 0 of the output voltage exhibits the output voltage when clearing the initial electric charges of the integration capacitor to zero, and hence does not exhibit the earth potential. In the figure, the dotted line shows the case where the offset error is absent, while the solid line shows the case where the offset error is present which has the same polarity as that of the sensor voltage of the battery current and the magnitude of which is half that of the sensor voltage of the battery current. Since when the transition is made from the status a to the status b, or from the status b to the status a, the connection polarity of the integration capacitor is inverted, as indicated by arrows in the figure, the output voltage is inverted every time the transition is made. When the transition is made from Ta1 to Tb1, the integration of only the component of the offset error undergoes a transition with as the starting point the voltage which is obtained by inverting the output voltage at the last time of Ta1, and at the last time Tb1, the voltage transition when the offset error is present matches the output voltage when the offset error is absent as indicated by the dotted line. Right after the transition has been made from Tb1 to Ta2, the voltage transition when the offset error is present matches the output voltage when the offset error is absent at the final time of Ta1. Thereafter, the same repetition will be made in turn, and at the initial time of each time period of the status a, the output voltage can be obtained which corresponds to the value which is obtained by integrating only the sensor voltage of the battery current which is free from the influence of the offset error.

Next, the case where the offset error is present so as to be opposite in polarity to the sensor voltage of the battery current is shown in FIGS. 5A and 5B. The figures illustrate the specific case where the magnitude of the offset error is ¼ of that of the sensor voltage of the battery current. In the figures, the gradient during the time period of the status a in the case indicated by the solid line is smaller than that in the case indicated by the dotted line in opposition to the example shown in FIGS. 4A and 4B. In addition, the gradient during the time period of the status b is opposite to that in the example shown in FIGS. 4A and 4B. But, the effects in which the influence of the offset error is removed is quite the same.

Then, when looking at either FIGS. 4A and 4B or FIG. 5A and 5B, both of the electric charges accumulated in the integration capacitor and the output voltage of the integrator are increased with the transition of time, and hence it is foreseen that both of the electric charges of the integration capacitor and the output voltage will finally reach the operation limitation of the circuit so that the circuit operation will be broken down. Therefore, it is one measure that when using the circuit of interest, the time period when carrying out the integration is limited to the range in which the circuit operation is not broken down at all. In addition, another method is the method wherein whenever the integration value has reached a predetermined value, resetting of the electric charges in the integration capacitor is repeatedly carried out, and the count value of the number of resets is utilized in combination therewith. This method will hereinbelow be described by referring back to FIG. 1 again.

In FIG. 1, the first voltage comparator 8 compares the output voltage of the integrator 5 with a first threshold voltage for integration reset ($V_{RESET1}$), and makes transition for the output voltage from LOW to HIGH at the time when the output voltage of the integrator 5 has risen from a lower level to reach $V_{RESET1}$ with the transition of time. At the time when the output voltage of the first voltage comparator 8 has gone to HIGH, the integration resetting switch 10 is turned on and the electric charge accumulated in the integration capacitor 6 are substantially, instantaneously reset to zero. At the time when the electric charges in the integration capacitor 6 has been reset to zero, the input voltage of the integrator 5 becomes the initial value (zero), and then the first voltage comparator 8 makes transition for the output voltage to LOW. Then, the integration resetting switch 10 is returned back to off, and the next integration is continued. In this connection, it takes a measure of time, though it is a short time period, to reset the electric charges in the integration capacitor, and for this time period, the output of the first voltage comparator 8 needs to be maintained HIGH. This is the necessary condition. With regard to this, it is normal that fortunately, the operational amplifier as the constituent element of the integrator 5 can not respond rapidly thereto so that it is slightly delayed to make the transition for the first voltage comparator 8 to LOW, thereby fulfilling the above-mentioned necessary condition. In order that the abovementioned necessary condition may be more surely fulfilled, a fixed duration holding circuit such as one shot multi-vibrator may be inserted in the middle of the path through which the output of the first voltage comparator 8 is introduced into the integration resetting switch 10.

By repeating the above-mentioned integration and reset, it is possible to avoid the problem that the output voltage of the integrator 5 is more and more increased to break down the circuit operation, and also it is possible to continue the integration. In addition, by counting the number of resets, it is possible to obtain the integration value of the total time. Now, when the count value of the number of resets is K, if Expression (6) is applied, then the following equation is established.

$$K \cdot V_{RESET1} + \text{(output voltage of integrator after final reset)} = (1/C) \int_{Ta} R_{SENS} I_s / R_g) dt \quad (7)$$

If K is so large as to be equal to or larger than several tens in Expression (7), when the output voltage of the integrator after the final reset can be disregarded, and the integrated value of the battery current (Is) is obtained as follows by using the count value (K) of the number of reset.

$$\int_{Ta} (I_s) dt = K \cdot V_{RESET1} \cdot C \cdot R_g / R_{SENS} \quad (8)$$

In this connection, the necessary condition that K needs to be so large as to be equal to or larger than several tens, in regarding about the original object of the present invention, is fulfilled more than enough, since K is naturally the larger number when a user may be anxious about the battery energy remainder. If by the special case, the small integration value area is measured, it is possible to cope therewith by setting the capacitance value of the integration capacitor and other constants in correspondence therewith.

Now, the situation of the above-mentioned integration reset will hereinbelow be described in more detail with reference to a waveform chart.

Figure 6:
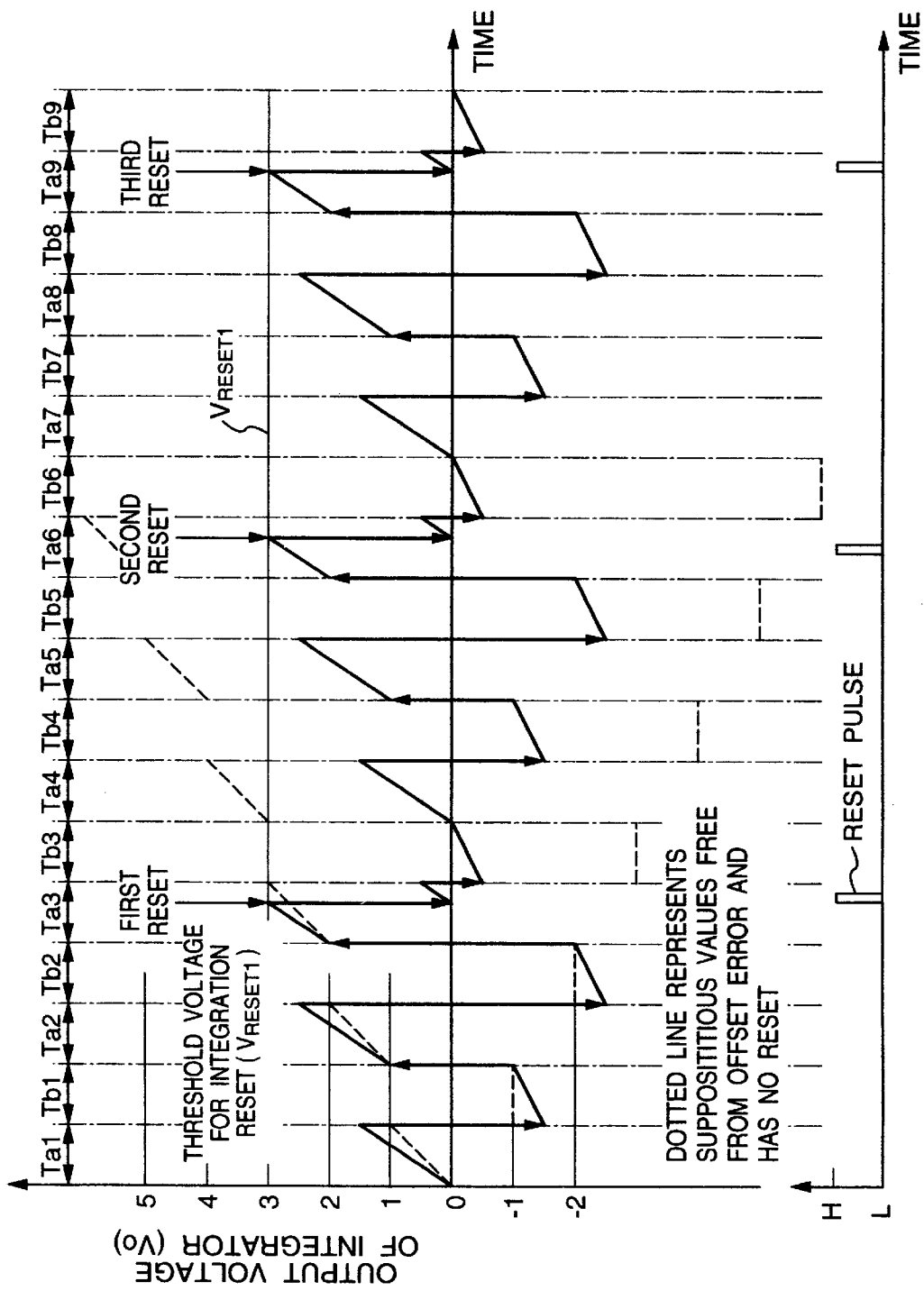
FIG. 6 is a diagram showing a waveform of an integrator.

FIG. 6 is a waveform chart of the output voltage of the integrator when under the same conditions as those as has already been described with reference to FIGS. 4A and 4B, the above-mentioned integration reset is applied. In the figure, the origin 0 on the axis of ordinate exhibiting the output voltage represents the output voltage when clearing the initial electric charges accumulated in the integration capacitor as same as shown in FIG. 4 and FIG. 5. Also, the first threshold voltage for integration reset ($V_{RESET1}$) is similarly defined, and in this example, it is set to 3V. The magnitude of the offset error is half that of the sensor voltage of the battery current and also the polarity of the offset error is the same as that of the sensor voltage of the battery current. The dotted line during the time period Ta1 in the figure represents the output voltage corresponding to the integration value of only the sensor voltage when supposing that the offset error of the battery current is absent, and the increase in voltage during the time period Ta1 is 1V. On the other hand, the solid line represents the output voltage corresponding to the integration value containing therein the offset error, and the increase in voltage during the same time period Ta1 is 1.5V. The output voltage of the integrator has reached $V_{RESET1}$ in the middle of the time period Ta3, and hence the output voltage of the integrator is reset to zero. This is the first reset. Then, the second reset occurs in the middle of the time period Ta6 when a time 3 times as large as (Ta+Tb) has elapsed from the first reset. After this, the third reset occurs at the same cycle, and then such reset will be repeatedly carried out. This repetition is illustrated in the form of reset pulses in the lower side of the figure.

The time period TaN and the time period TbN are paired in order to cancel the offset, and hence for example, the total sum of integration values until the end time of Tb9 which is obtained on the basis of the count value of the number of resets is compared with that obtained on the basis of the supposititious values (indicated by the dotted line in the figure) which are free from the offset error. First of all, in the former, since the count value K is 3, $V_{RESET1}$=3V and the voltage at the end time of Tb9 is zero, the total sum of integration values is 9V. On the other hand, in the latter, since the increase in voltage during the time period Ta1 is 1V and this is repeated for the nine time periods, the total sum of integration values is 9V. In such a way, it is understood that the total sum of integration values which are obtained on the basis of the count value matches the total sum of integration values of the suppositious values which are free from the offset error.

The case of FIG. 6 as described above is the case where the cycle of switching Ta and Tb is set to be short in such a way that a plurality of time periods Ta and Tb are present between the reset cycle. Next, the description will hereinbelow be given with respect to the case where conversely, the cycle of switching Ta and Tb is set to be longer.

Figure 7:
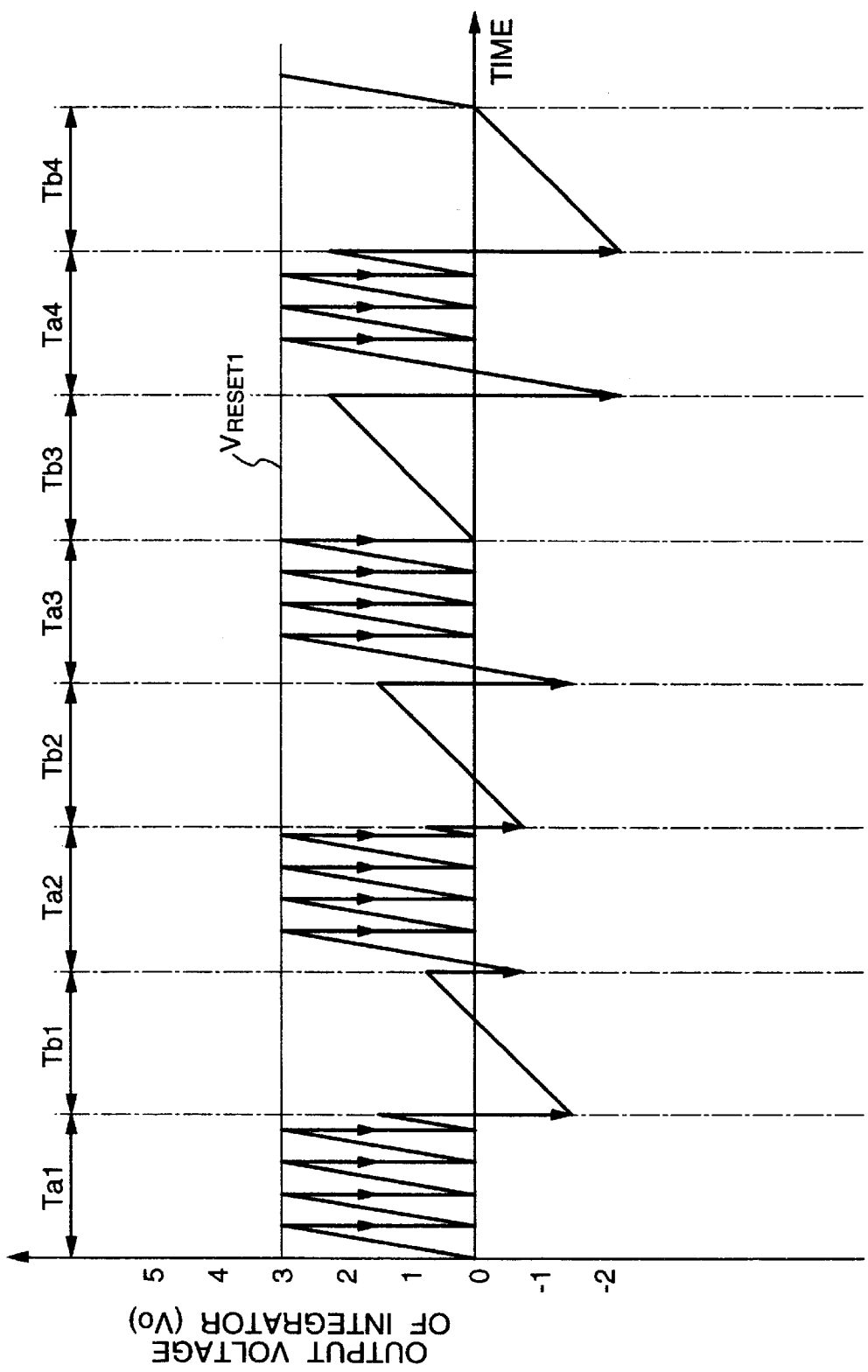
FIG. 7 is a diagram showing a waveform of an integrator.

FIG. 7 is a waveform chart of the output voltage of the integrator in the case where the cycle of switching Ta and Tb is set to be longer than the reset: cycle. The definition of the origin of the axis of ordinate is similar to that of FIG. 6. The first threshold voltage for integration reset ($V_{RESET1}$) is set to 3V. Also, the magnitude of the offset error is 1/5 of that of the sensor voltage of the battery current and the polarity of the offset error is the same as that of the sensor voltage of the battery current. During the first time period (Ta1) of the status a, the offset error is added to the sensor voltage of the battery current at the ratio of 0.2:1 and the resultant value is integrated. Then, whenever the integration output voltage has reached $V_{RESET1}$, the reset is carried out, and as a result, for this time period, the number of resets is 4. During the subsequent time period Tb1, only the offset component is integrated, and at the initial time of Ta2, the output voltage of the integrator is obtained in which the offset component is canceled during Ta1 and Tb1. After this, this operation is repeatedly carried out to cancel the offset component, and also by counting the number of resets, the integration value of only the battery current component can be obtained. In the example shown in the figure, since K=15 and $V_{RESET1}$=3V, the total sum of output voltages of the integrator for the time period ranging from Ta1 to Tb4 is 45 V.

In such a way, as understood from the cases of FIGS. 6 and 7, with respect to the length relation between the cycle of switching the status a and the status b and the reset cycle, one of them may be longer or one of them may be shorter.

Referring back to FIG. 1 again, the pulse counter 11 counts the number of reset pulses which are generated at the output terminal of the first voltage comparator 8. The counter value reading means 12 latches the counter value of the pulse counter 11 at the timing of receiving a read instruction. By looking at that output, it is possible to be aware of the accumulated value of the battery current until the time of receiving the read instruction. The means 13 for calculating a unit time average current value stores the battery current accumulated value which has been read out in accordance with the last read instruction and calculates a difference between the last battery current accumulated value and the newest battery current accumulated value. By dividing the difference by the time interval of the read instruction, it is possible to be aware of the unit time average current value. In addition, if the read instruction interval is suitably set to a small time, then this unit tine average current value can be regarded as substantially the instantaneous current value.

Next, the description will hereinbelow be given with respect to the case where in FIG. 1, the operation mode is switched from the discharge mode in which the charging/discharging switching unit 15 supplies the battery current to the load over to the charge mode in which the battery charger 14 causes the charging current to flow into the battery 1. In this connection, it is assumed that the input status selector 4 is of the type shown in FIG. 2C similarly to the previous description.

In this case, the battery 1 is the chargeable secondary battery/rechargeable battery. Then, the charging operation will hereinbelow be described. Since in the charging operation, the current which is caused to flow through the current sensor resistor 2 is opposite in direction to the discharging current, the sensor voltage is, of course, opposite in direction thereto. Therefore, the electric charges which are integrated in the integrator 5 to be accumulated in the integration capacitor 6 is also opposite in polarity to the electric charges in the discharging operation, and hence the transition of the output voltage of the integrator is changed in opposition to that of the discharging operation, i.e., in the minus direction. The second voltage comparator 16 compares the output voltage which makes the transition in the minus direction with a second threshold voltage for integration reset ($V_{RESET2}$), and makes the transition for the output voltage of the integrator 5 from LOW to HIGH at the time when the output voltage of the integrator 5 has dropped from the higher level to reach $V_{RESET2}$ with the transition of time. At the time when the output voltage of the second voltage comparator 16 has gone to HIGH, the output of the OR gate 18 makes the transition from LOW to HIGH, and at the same time, the integration resetting switch 10 is turned on to clear the electric charges of the integration capacitor 6. The operation from now on is the same as that in the case of the above-mentioned discharge mode.

In this connection, if the output voltage of the integrator when clearing the initial electric charges in the integration capacitor is made the reference voltage, then $V_{RESET1}$ and $V_{RESET2}$ are respectively located in the plus and minus voltages which are symmetric with respect to the reference voltage.

The pulse counter 11 is of a up/down type in the present embodiment. The output of the first voltage comparator 8 and the output of the second voltage comparator 16 are connected to a up-count terminal and a down-count terminal of the pulse counter 11, respectively. In the charging operation, as described above, the operation of the integration reset is controlled by the second voltage comparator 16, and the pulse inputted to the down-count input terminal of the pulse counter 11. Therefore, whenever as progress of the charging operation, the integration reset is generated, the count value of the pulse counter 11 is decremented one by one. In this case, the decrement of the count value means that the battery is charged only for the decrement. In the case where the apparatus to which the present invention is applied is switched from the operation mode (the discharge mode) over to the charge mode in the middle of the operation, the pulse counter 11 proceeds from the up-count to the down-count to continue the counting. As a result, it is possible to measure generally the increase and decrease of the electric charges due to the discharge and the charge, which results in the battery energy remainder being able to be aware of.

Figure 8:
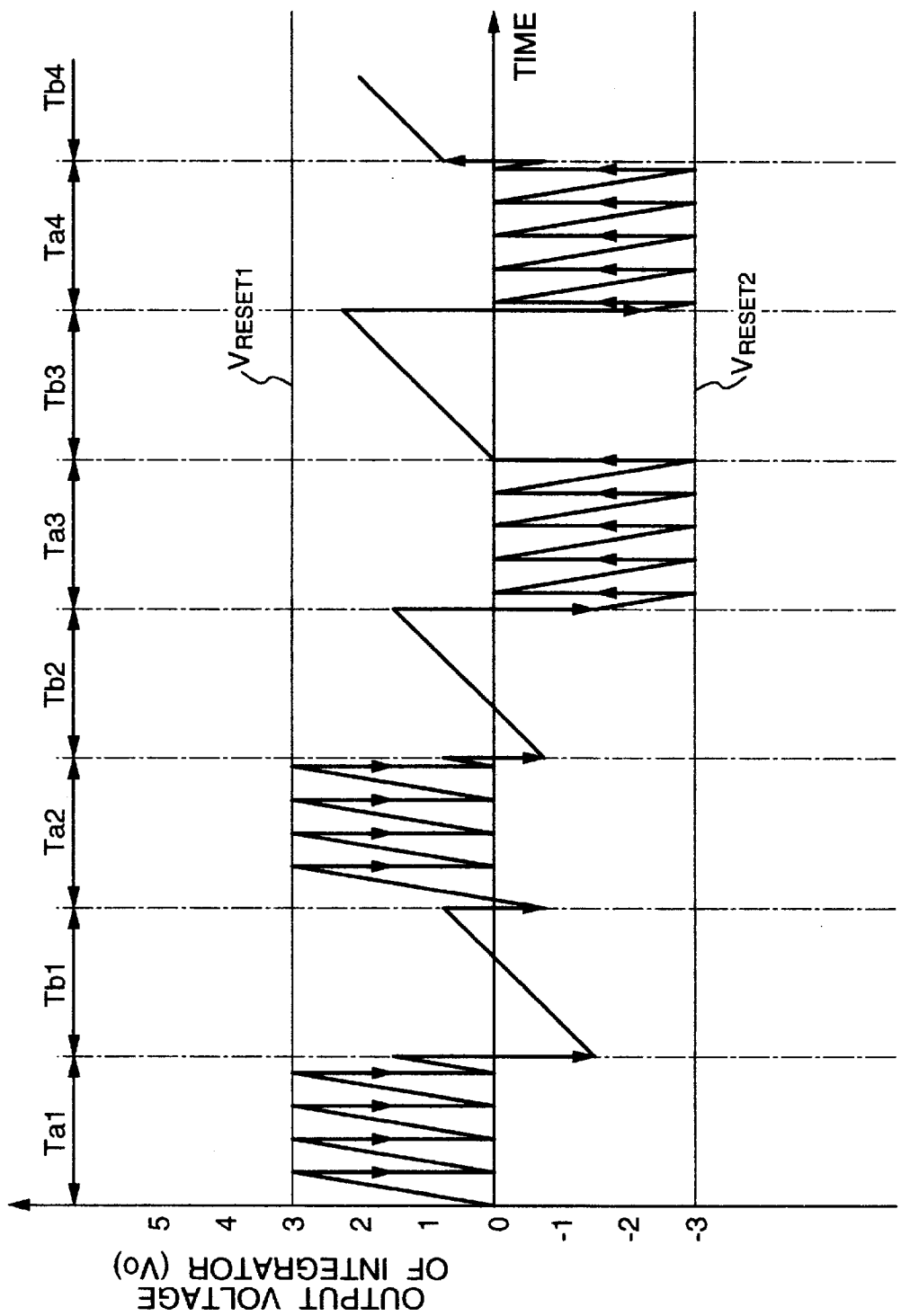
FIG. 8 is a diagram showing a waveform of an integrator.

FIG. 8 shows a waveform chart of the output voltage of the integrator when the operation mode is switched from the discharge mode over to the charge mode. That is, there is shown the case where at the end time of Tb2, the operation mode is switched from the discharge mode over to the charge mode. In this case, $V_{RESET1}$ is 3V and $V_{RESET2}$ is -3V.

Next, the description will hereinbelow be given with respect to the operation and the effects of the up/down inverter 19. The input status selector 4 is of the type shown in FIG. 2C similarly to the previous description.

The up/down inverter 19 operates synchronously with the status switching of the input status selector 4 and acts to alternate the up-count input and the down-count input of the pulse counter 11 for the status a and the status b. In the example as shown in the figure, in the status a, the output of the first voltage comparator 8 and the output of the second voltage comparator 16 are connected to the up-count input terminal and the down-count input terminal of the pulse counter 11, respectively, and in the status b, the connection is reversed.

Figure 9:
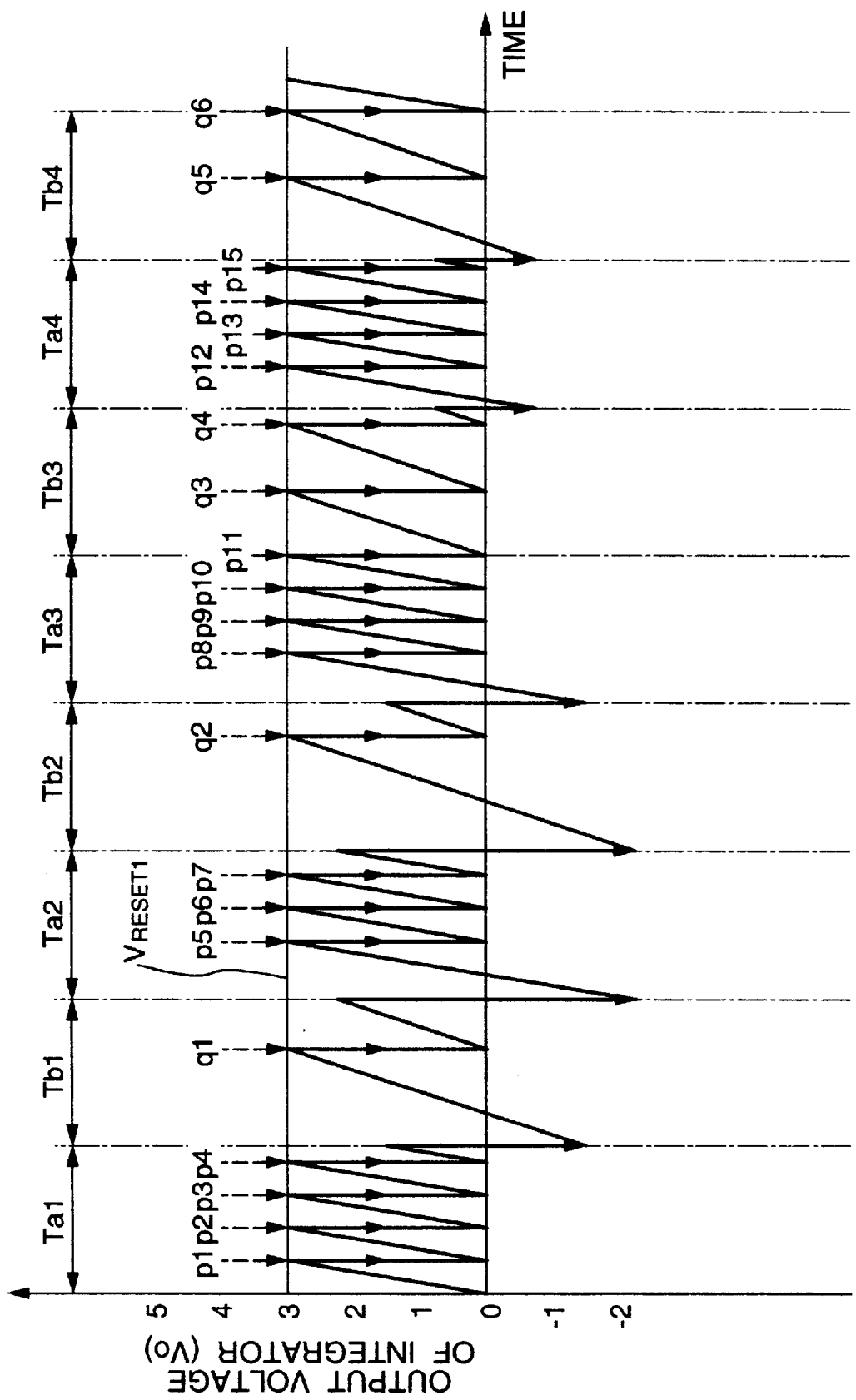
FIG. 9 is a diagram showing a waveform of an integrator.

FIG. 9 is a waveform chart of the output voltage of the integrator in the case where in the discharge mode, the sensor voltage (Vs) of the discharge current and the offset error voltage (Vd) have the ratio of 1:1 in magnitude and their directions are also identical to each other. During the time period of Ta, Vs and Vd are added to each other to be integrated, while during the time period of Tb, only Vd is integrated. In the figure, reference symbols p1, p2, . . . designate the reset pulses which are generated during the time periods of Ta, and reference symbols q1, q2, . . . designates the reset pulses which are generated during the time periods of Tb. On the basis of the operation of the up/down inverter 19, p1, p2, . . . are up-counted, while q1, q2, . . . are down-counted.

In the first place, though in the present first embodiment, the voltage change due to the integration during the time periods of Tb is subtracted from the voltage change due to the integration during the time periods Ta, in the case where as shown in the figure, the reset pulses are generated during the time periods of Tb, it is proper that the count value during the time period Tb is subtracted from the count value during the time periods of Ta, and hence the present embodiment is reasonable.

Figure 10:
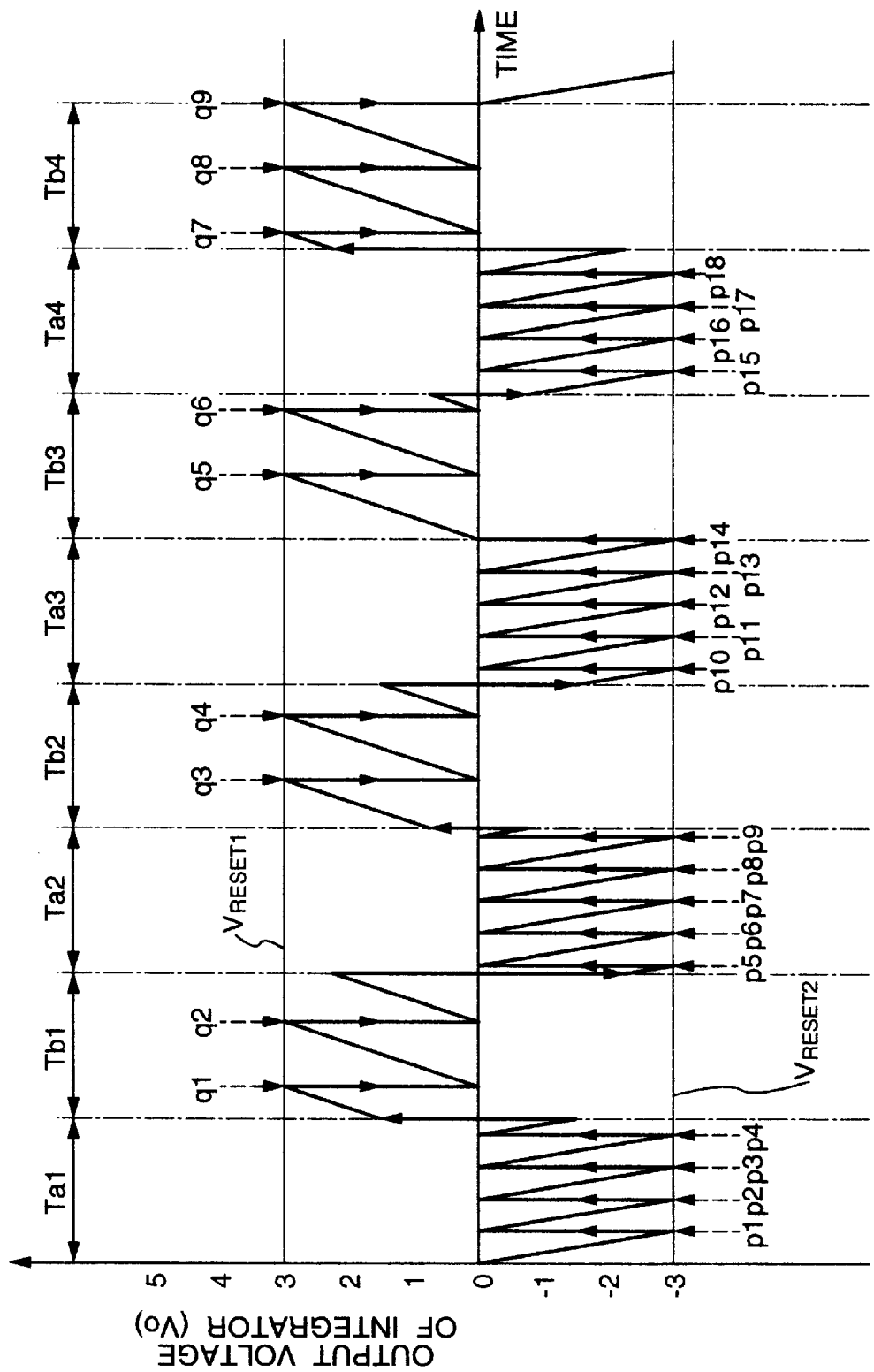
FIG. 10 is a diagram showing a waveform of an integrator.

Next, FIG. 10 shows a waveform chart of the output voltage of the integrator in the case where in the charge mode, the magnitude of the sensor voltage (Vs) of the charging current is 3 times as large as that of the offset error voltage (Vd). In this case, it is assumed that the offset error voltage (Vd) is the same as that in the case shown in FIG. 9. During the time periods of Ta, whenever the output voltage has reached $V_{RESET2}$, the reset pulses p1, p2, . . . are successively generated which pulses are down-counted by the pulse counter 11. While during the time periods of Tb, whenever the output voltage has reached $V_{RESET1}$ the . . . reset pulses q1, q2, . . . are successively generated, these reset pulses are down-counted by the operation of the up/down inverter 19.

Next, the case where the input status selector 4 is of the type shown in FIG. 2A and the integrator 5 is of the type shown in FIG. 3B is shown as a second embodiment of the present invention in FIG. 11. In the figure, reference numeral 4 designates the input status selector in which the connection polarity is inverted between the status a and the status b. Reference numeral 5 designates the integrator which is of the same type as that described with reference to FIG. 3B. The input voltage is converted into the current, the magnitude of which is gm times as large as that of the input voltage, by the voltage-to-current conversion amplifier 503 to be supplied to the minus terminal of the operational amplifier 501 in order to be accumulated in the form of the integration electric charges in the integration capacitor 6. Other reference numerals are the same as those in FIG. 1.

Now, let us consider the time period (Ta) when the input status selector 4 is in the status a (indicated by solid line arrows in the figure) and the connection-polarity inverter 7 for the integration capacitor is also in the status a (indicated by solid line arrows in the figure) synchronously with the operation of the input status selector 4. Then, the sensor voltage (Vs) which is expressed by the above-mentioned Expression (5) is introduced into the integrator 5 which causes, in turn, the current the value of which is obtained by multiplying the sensor voltage (Vs) by gm to flow through the integration capacitor 6, and then the electric charges equal to the integration value of that current are accumulated in the integration capacitor 6. Then, as the transition of the electric charges, the voltage developed across the output terminals of the integrator 5 is changed, and the amount of voltage change corresponds to the integration value of the sensor voltage (Vs).

In addition, since the voltage-to-current conversion amplifier 503 as the constituent element of the integrator 5 has the equivalent input offset voltage Vd, the electric charges corresponding to the integration value of the equivalent input offset voltage Vd are also accumulated together with the electric charges corresponding to the integrated value of the sensor voltage in the integration capacitor 6, and the voltage change due thereto is added to the amount of voltage change which is generated across the output terminals.

Next, let us consider the time period (Tb) after the input status selector 4 has made the transition to the status b (indicated by dotted line arrows in the figure) and the connection-polarity inverter 7 for the integration capacitor has also made the transition to the status b (indicated by dotted line arrows in the figure) synchronously with the operation of the input status selector 4. Since the input status selector 4 is in the status b, the sensor voltage (Vs) is inverted in polarity to be inputted to the integrator 5. Therefore, the integrator 5 integrates the sensor voltage (−Vs), which has been obtained by, inverting the polarity, together with the equivalent input offset voltage (Vd) of the voltage-to-current conversion amplifier 503 as the constituent element of that integrator 5. However, since in the status b, the connection polarity of the integration capacitor is inverted by the connection-polarity inverter for the integration capacitor, the integration capacitor 6 carries out the accumulation of the electric charges in such a way that the electric charges accumulated therein at the final time of the time period (Ta) of the previous status a are treated as the initial value, and during the time period (Tb) of the status b, with respect to the offset component, the electric charges equal to the integration value of the current having the value which is obtained by multiplying the equivalent input offset voltage (Vd) by gm are subtracted from the electric charges as the initial value. With respect to the component of the battery current, both of the sensor voltage and the connection polarity of the integration capacitor are inverted, and hence the integration electric charges during the time period (Tb) of the status b are added to the integration electric charges during the time period (Ta) of the status a.

As a result, the integration electric charges of the offset component are perfectly canceled over the time period (Ta) of the status a and the time period (Tb) of the status b, and only the integration electric charges of the battery current component are added over the time period (Ta) of the status a and the time period (Tb) of the status b.

Figure 12A:
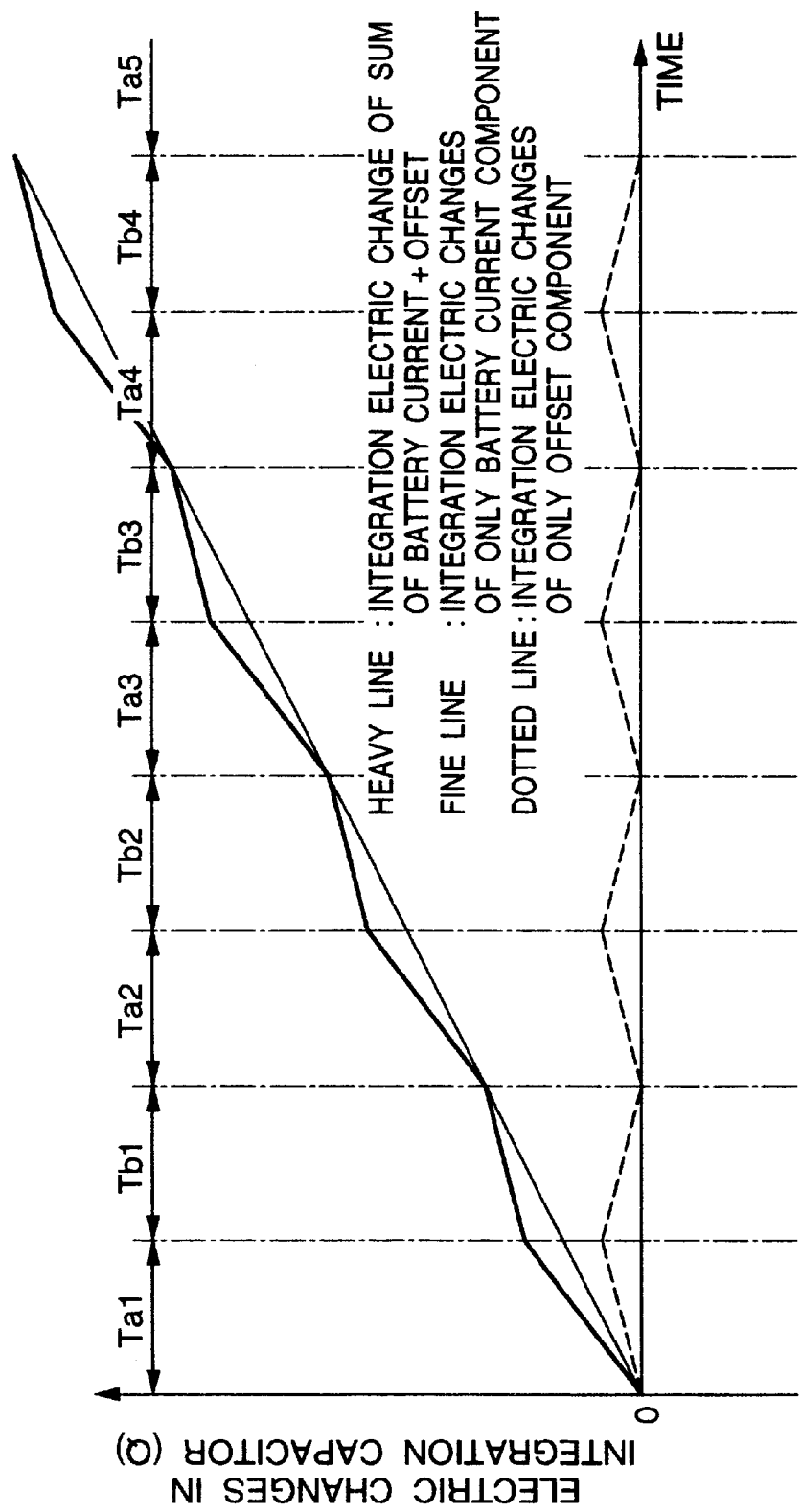
FIGS. 12A and 12B are respectively diagrams showing waveforms of an integration capacitor and an integrator.
Figure 12B:
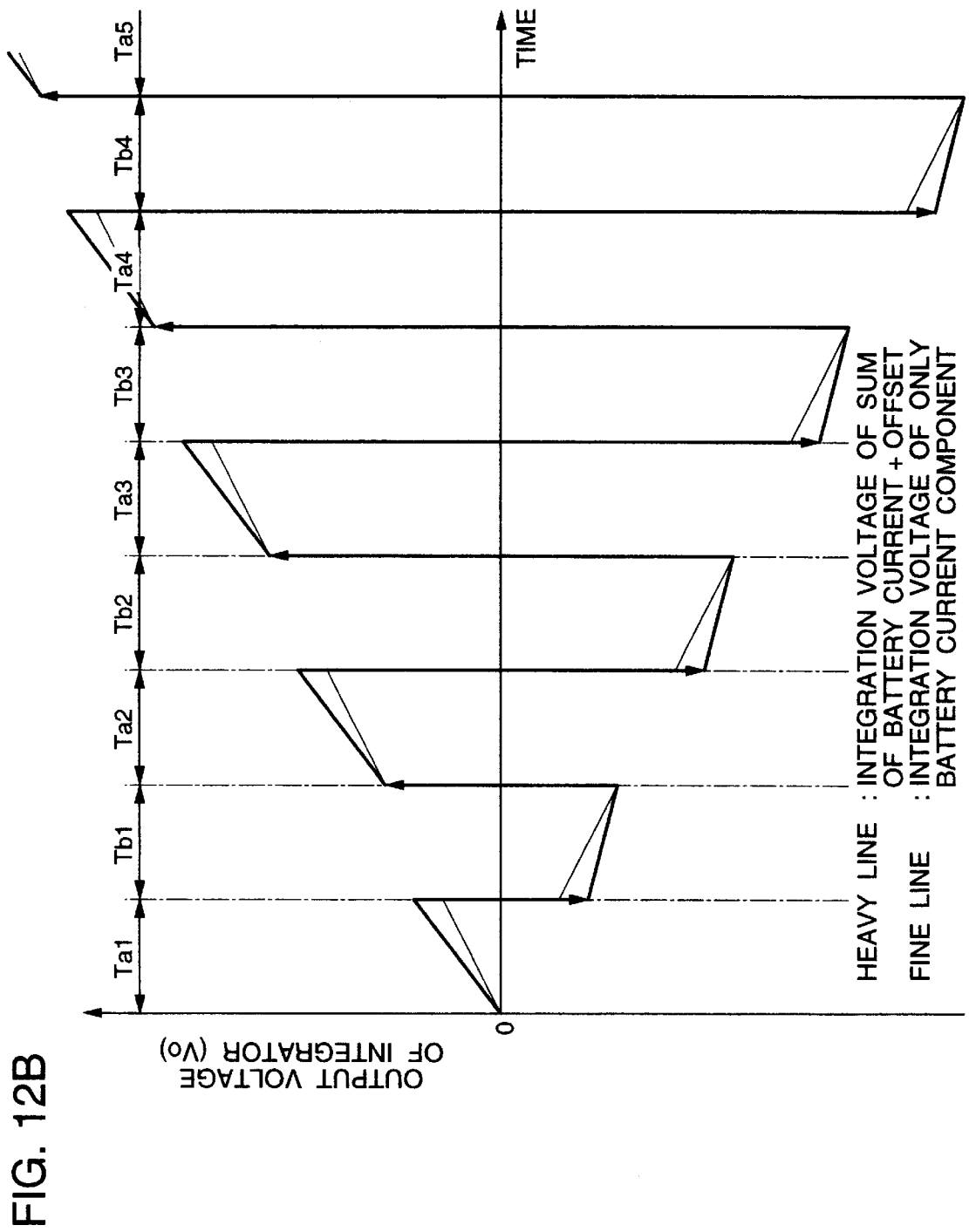

The voltage which is developed across the output terminals of the integrator 5 has the waveform in which the polarity of the integration voltage of the above-mentioned battery current component is inverted whenever the time period (Ta) and the time period (Tb) are alternately come round. The foregoing is illustrated in FIG. 12 showing an operation waveform chart in which in order that the operation of the cancelling of the offset and the integration of the battery current component may be easily understood, the operation of the integration reset is not taken into consideration. FIG. 12A shows the transition of the electric charges in the integration capacitor. In the figure, a fine line represents the integration electric charges of only the battery current component, a dotted line represents the integration electric charges of only the offset component, and a heavy line represents the total electric charges of both of the electric charges. The integration electric charges of the offset component are canceled over the time periods Ta and Tb. Therefore, the total integration electric charges of the integration electric charges of the battery current component and the integration electric charges of the offset component matches the integration electric charges of only the battery current component at the end time of the time period Tb. FIG. 12B shows the transition of the output voltage of the integrator. The origin 0 on the axis of ordinate in the figure represents the output voltage when clearing the electric charges accumulated in the integration capacitor to zero, and matches the reference voltage shown in FIG. 11. In the figure, a fine line represents the voltage when supposing that only the battery current component is integrated, and a heavy line represents the total output voltage containing therein the integration of the offset component. From this figure, it is understood that at the final time of the time period Tb or the initial time of the time period Ta, the total output voltage becomes the voltage which is obtained when integrating only the battery current component.

Reference is made back to FIG. 11 again, and the description will hereinbelow be given with respect to the operation including the integration reset and the pulse counting. The first voltage comparator 8 and the second voltage comparator 16 operates with as the respective comparison reference voltages the threshold voltages for integration reset ($V_{RESET1}$, and $V_{RESET2}$) which are respectively located in the plus and minus voltages which are symmetric with respect to the reference voltage in the figure. Then, at the time when the output voltage of the integrator has risen to reach $V_{RESET1}$ the output of the first voltage comparator 8 makes the transition to HIGH, while at the time when the output voltage of the integrator has dropped to reach $V_{RESET2}$, the output of the second voltage comparator 16 has made the transition to HIGH. Then, at the time when one of the outputs of the first and second voltage comparators 8 and 16 has made the transition to HIGH, the integration switch 10 is turned on to clear the electric charges in the integration capacitor 6, thereby resetting the integration. At this time, the operation in which the pulse is generated at the output of the associated voltage comparator is the same as that of the above description.

The up/down inverter 19 operates synchronously with the status switching of the input status selector 4 and acts to change alternately the up-count input and the down-count input of the pulse counter 11. In the example shown in the figure, in the status a, the output of the first voltage comparator 8 and the output of the second voltage comparator 16 are connected to the up-count input terminal and the down-count input terminal of the pulse counter 11, respectively, while in the status b, the connection is reversed. Since the status b corresponds to the time period when the sensor voltage of the battery current is integrated with its polarity inverted, and the direction of the change in the output voltage of the integrator during this time period is also inverted, the reset pulses which are generated during this time period are counted with up/down inverted. With respect to the reset pulses as well which are generated due to the offset component, since the time period of the status b is the time period when the subtraction is made for the offset component, the counting thereof is made with up/down inverted. This is reasonable.

FIG. 13A is a waveform chart of the output voltage of the integrator in the case where in the discharge mode, the sensor voltage (Vs) of the discharging current and the offset error voltage (Vd) have the ratio of 2:1 in magnitude and the directions of the sensor voltage (Vs) and the offset error voltage (Vd) are identical to each other. During the time period Ta, Vs and Vd are added to each other to be integrated, while during the time period Tb, −Vs and Vd are added to each other to be integrated. In the figure, reference symbols p1, p2, designate the reset pulses which are generated during the time periods Ta, while reference symbols q1, q2, . . . designate the reset pulses which are generated during the time periods Tb. On the basis of the operation of the up/down inverter 19, the reset pulses p1, p2, . . . are up-counted, and the reset pulses q1, q2, . . . are also up-counted.

Incidentally, in the second embodiment, other operations are the same as those of the above-mentioned first embodiment, and hence the description thereof is omitted here for the sake of simplicity.

Figure 13B:
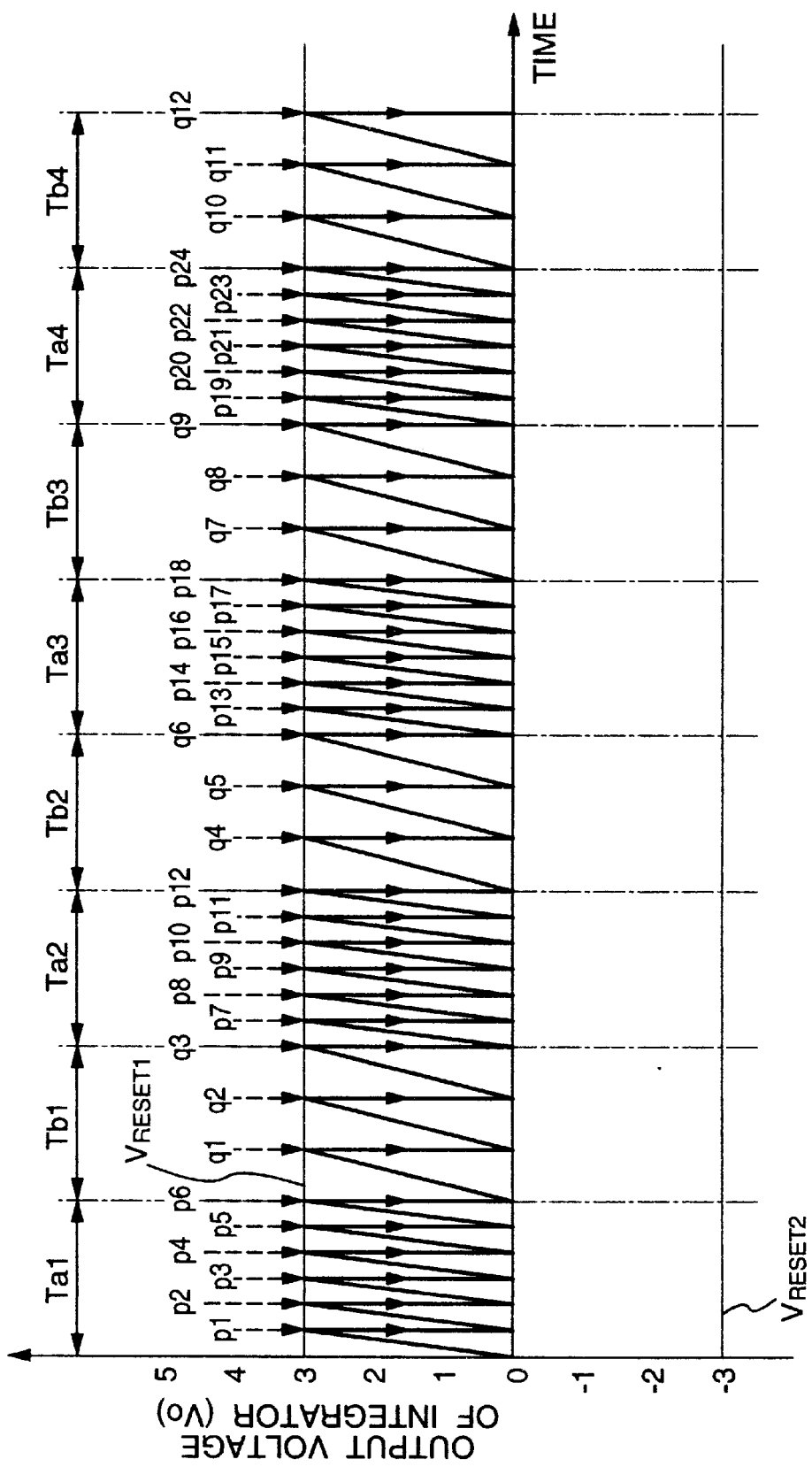

FIG. 13B is a waveform chart of the output voltage of the integrator in the case where in the discharging mode, the sensor voltage (Vs) of the discharging current and the offset error voltage (Vd) have the ratio of 1:3 in magnitude and the directions of the sensor voltage (Vs) and the offset error voltage (Vd) are identical to each other. During the time period Ta, Vs and Vd are added to each other to be integrated, while during the time period Tb, −Vs and Vd are added to each other to be integrated. In the figure, reference symbols p1, p2, designate the reset pulses which are generated during the time periods Ta, while reference symbols q1, q2, . . . designate the reset pulses which are generated during the time periods Tb. On the basis of the operation of the up/down counter 19, the reset pulses p1, p2, . . . are up-counted, while the reset pulses q1, q2, . . . are down-counted.

Another point to which attention should be paid in the case shown in FIG. 13B is that out of the first and second voltage comparators, the voltage comparators) which generates) the reset pulses is(are) only the first comparator which is operated with $V_{RESET1}$ as the comparison reference voltage. This phenomenon occurs when the condition is fulfilled in which the absolute value of the offset error voltage (Vd) is larger than that of the sensor voltage (Vs) of the discharging current. This suggests that if the bias were intentionally applied in such a way that the offset error voltage (vd) is generated so as to be biased towards one of the plus side or minus side, then one of the two voltage comparators can be omitted only in the case of the measurement of the small current flow region in which the absolute value of the sensor voltage (Vs) is smaller than that of the offset error voltage (Vd).

In this connection, while in the above description, the up/down type pulse counter has been described in the form pf one pulse counter which is designed in such a way that whenever the pulse is inputted to its up-count input terminal, the count value is incremented one by one, while whenever the pulse is inputted to its down-count input terminal, the count value is decremented one by one, it should be noted that the up/down type pulse counter is not limited to this type. For example, the up/down type pulse counter means is well known which is designed in such a way as to include a pulse counter for counting, in one direction, the pulses inputted to its up-count input terminal and a pulse counter for counting, in one direction, the pulses inputted to its down-count input terminal. In this up/down type pulse counter, by subtracting the count value of the other pulse counter from the count value of one pulse counter of the two pulse counters, the function can be obtained which is substantially equal to that of one up/down type pulse counter as described above.

Figure 14:
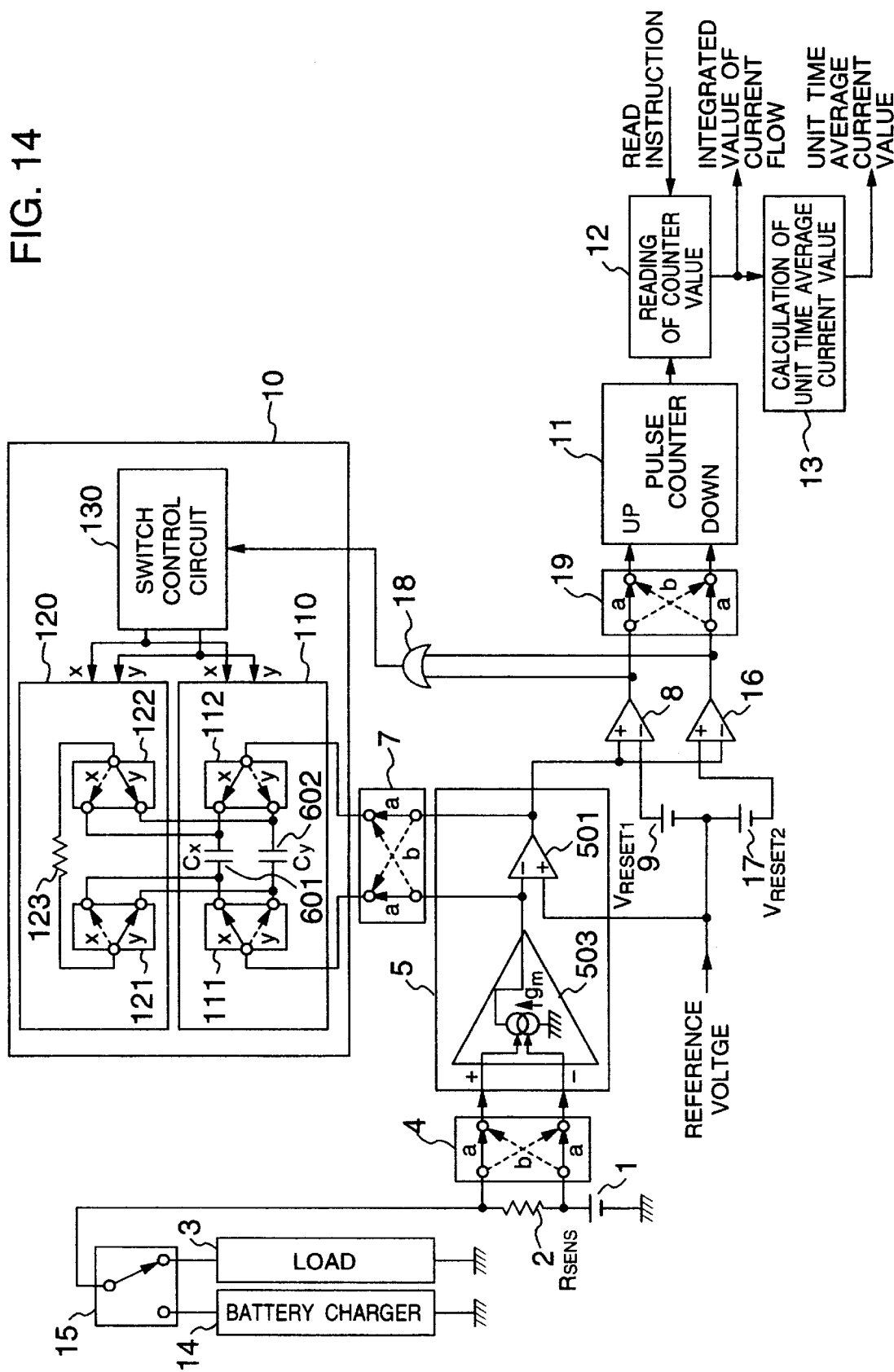
FIG. 14 is a block diagram, partly in circuit diagram, showing a configuration of a third embodiment of the present invention.

Next, a third embodiment of the present invention will hereinbelow be described with reference to FIG. 14. In FIG. 14, a frame designated by reference numeral 10 represents integration resetting means, and its contents are the novel portion which is different in construction from the above-mentioned second embodiment. Then, the novel integration resetting means 10 will hereinbelow be described. In the figure, reference numeral 110 designates capacitor selection means for integration, reference numerals 111 and 112 designate integration selection switches, respectively, reference numeral 120 designates means for discharging capacitor electric charges, reference numerals 121 and 122 designate discharge selection switches, respectively, reference numeral 123 designates a discharge resistor, reference numeral 130 designates a switch control circuit, and reference numerals 601 and 602 designate integration capacitors Cx and Cy, respectively. In this connection, while both of the integration capacitors Cx and Cy are illustrated in the frame of the integration resetting means 10, this is for the sake of convenience of illustration in the figure, and hence those integration capacitors correspond to the integration capacitor 6 shown in FIG. 11 as has already been described.

While the two integration capacitors Cx and Cy have the same capacitance and are identical in function to each other, for the sake of convenience of making the description in correspondence to the statuses of the integration selection switches and the discharge selection switches, those capacitors are distinguished from each other by adding suffixes x and y thereto, respectively. The integration selection switches 111, 112 and the discharge selection switches 121, 122 are both controlled by the switch control circuit 130 in such a way that when the integration selection switches select the integration capacitor Cx, the discharge selection switches select the integration capacitor Cy, while when the integration switches select Cy, the discharge selection switches select Cx.

The switch control circuit 130 is driven by the output pulse, as the trigger, of the OR gate 18, and whenever inputting the trigger thereto, switches HIGH and LOW of the two outputs x and y. This is realized in the form of a flip-flop circuit. In this connection, while in general, the trigger is the leading or trailing edge of the pulse, the selection therebetween depends on the logic configuration of the overall circuit, and hence this is not essential. Since in the example shown in the figure, the leading edge of the pulse is made the trigger, the description will hereinbelow be given on the assumption that the trigger corresponds to the leading edge of the pulse.

By adopting such a configuration, whenever the output of the OR gate 18 has made the transition from LOW to HIGH, LOW and HIGH of the outputs x and y of the switch control circuit 130 are changed over to each other, and as a result, at the time when the integration selection switch has been switched from x over to y, the discharge selection switch is switched from y over to x, or at the time when the integration selection switch is switched from y over to x, the discharge selection switch is switched from x over to y.

The electric charges accumulated in the integration capacitor which is selected by the discharge selection switch are discharged through the discharging resistor 123 during the time period of selecting the discharge to perfectly clear the electric charges accumulated therein. Therefore, next, at the time when the output of the OR gate 130 makes the transition from LOW to HIGH, the integration selection switches and the discharge selection switches are both inverted so that the integration capacitor is switched from the integration capacitor in which the electric charges have been accumulated until that time over to the integration capacitor in which the electric charges have already been cleared. When viewed from the integrator 5, this is equal to the fact that the electric charges are approximately, instantaneously cleared to zero, which results in the same function as that of the integration resetting switch in each of the first and second embodiments being obtained.

In this connection, for the resistance value of the discharging resistor 123, it is desirable that the time constant which is obtained by the product of that resistance value and the capacitance value of the integration capacitor is such a short time as to be equal to or shorter than about 10% of the shortest time of the integration reset cycle. On the other hand, since if the resistance value is so low, then the peak current during the discharge becomes large, it is better that the resistance value is determined on the basis of the equilibrium therebetween.

In a word, the present embodiment is such that the two integration capacitors are provided, and during the time period when the electric charges are accumulated in one integration capacitor, the electric charges accumulated in the other integration capacitor are cleared, and whenever the output voltage of the integrator has reached the threshold voltage for integration reset, the two integration-capacitors are changed over to each other, thereby carrying out the integration reset.

The advantages of the present embodiment are that the integration reset is carried out effectively, approximately in an instant; that since time can be spent in clearing the accumulated electric charges, there is no generation of the pulse-like large current as in the case where the capacitor is short-circuited by the reset switch; that for the conducting resistance of the switch, the higher resistance than that in the reset switch is allowed; and so forth.

Figure 15:
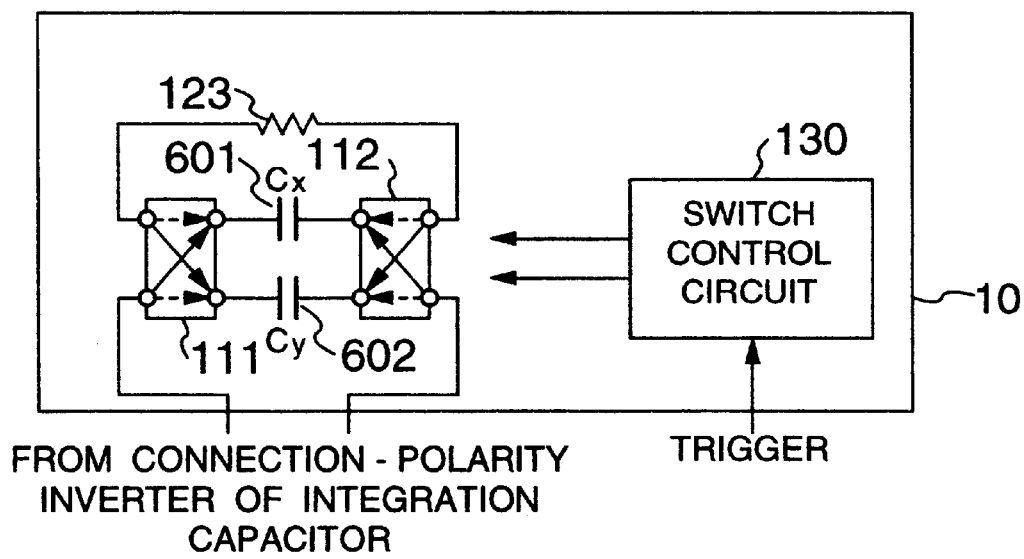
FIG. 15 is a circuit diagram, partly in block diagram, showing a configuration of a modification of integration resetting means.

FIG. 15 shows a modification of the integration selection switches and the discharge selection switches in the above-mentioned third embodiment. In this connection, there is shown the modification wherein the integration selection switches and the discharge selection switches are illustrated so as to be functionally overlapped each other.

Figure 16:
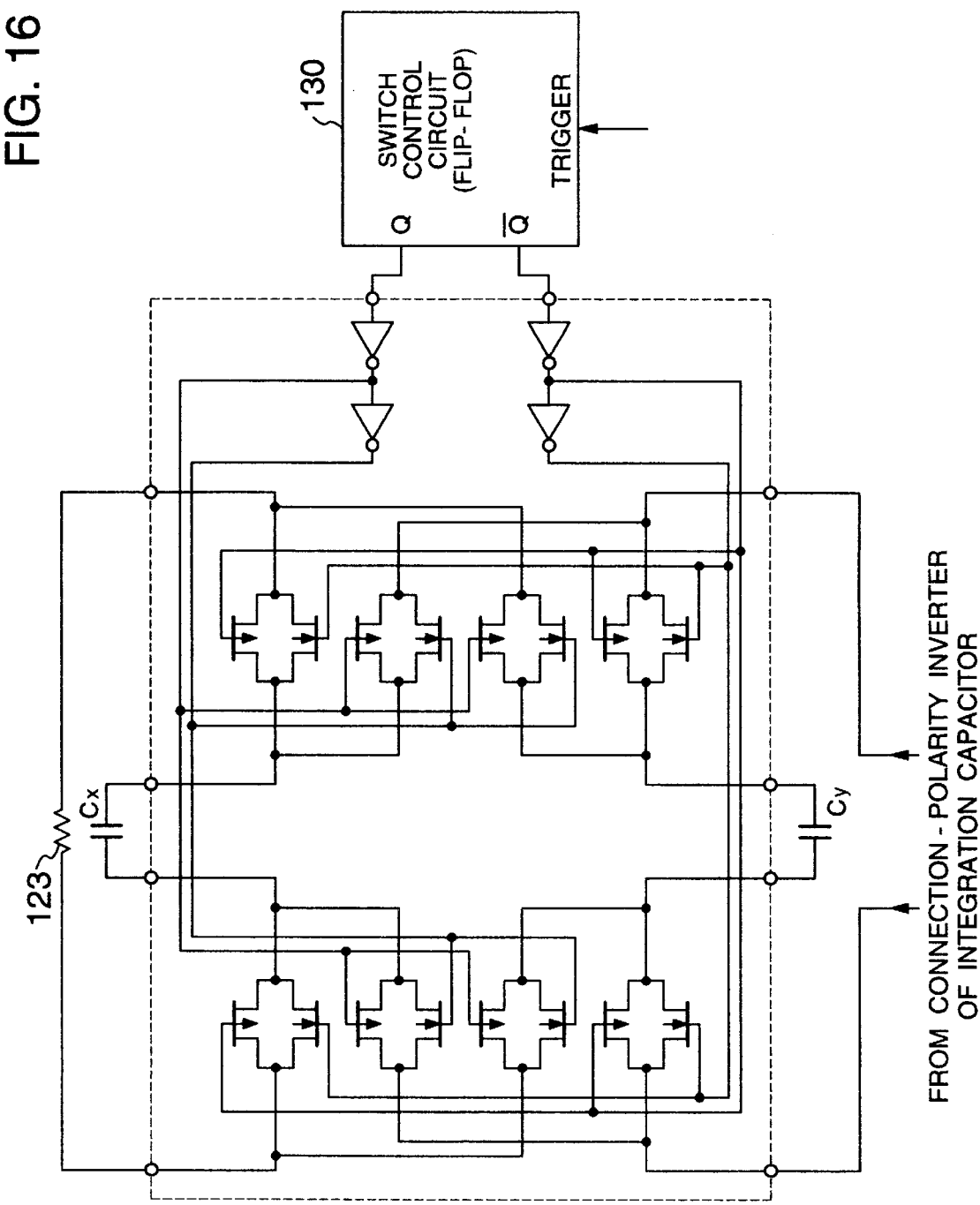
FIG. 16 is a circuit diagram showing a configuration of an embodiment in which an integration selection switch and a discharge selection switch are constituted by MOS transistors.

FIG. 16 shows an embodiment wherein both of the integration selection switches and the discharge selection switches are constituted by MOS transistors. In this embodiment, one unit of switch is constructed by connecting an NMOS transistor and a PMOS transistor in parallel with each other, and then a plurality of units of switches are employed, and also off and on thereof are combined to realize each of the selection switches.

In this connection, such a switch circuit which is constituted by the MOS transistors may also be utilized for the input status selector 4 and the connection-polarity inverter 7 for the integration capacitor as described above.

Figure 17:
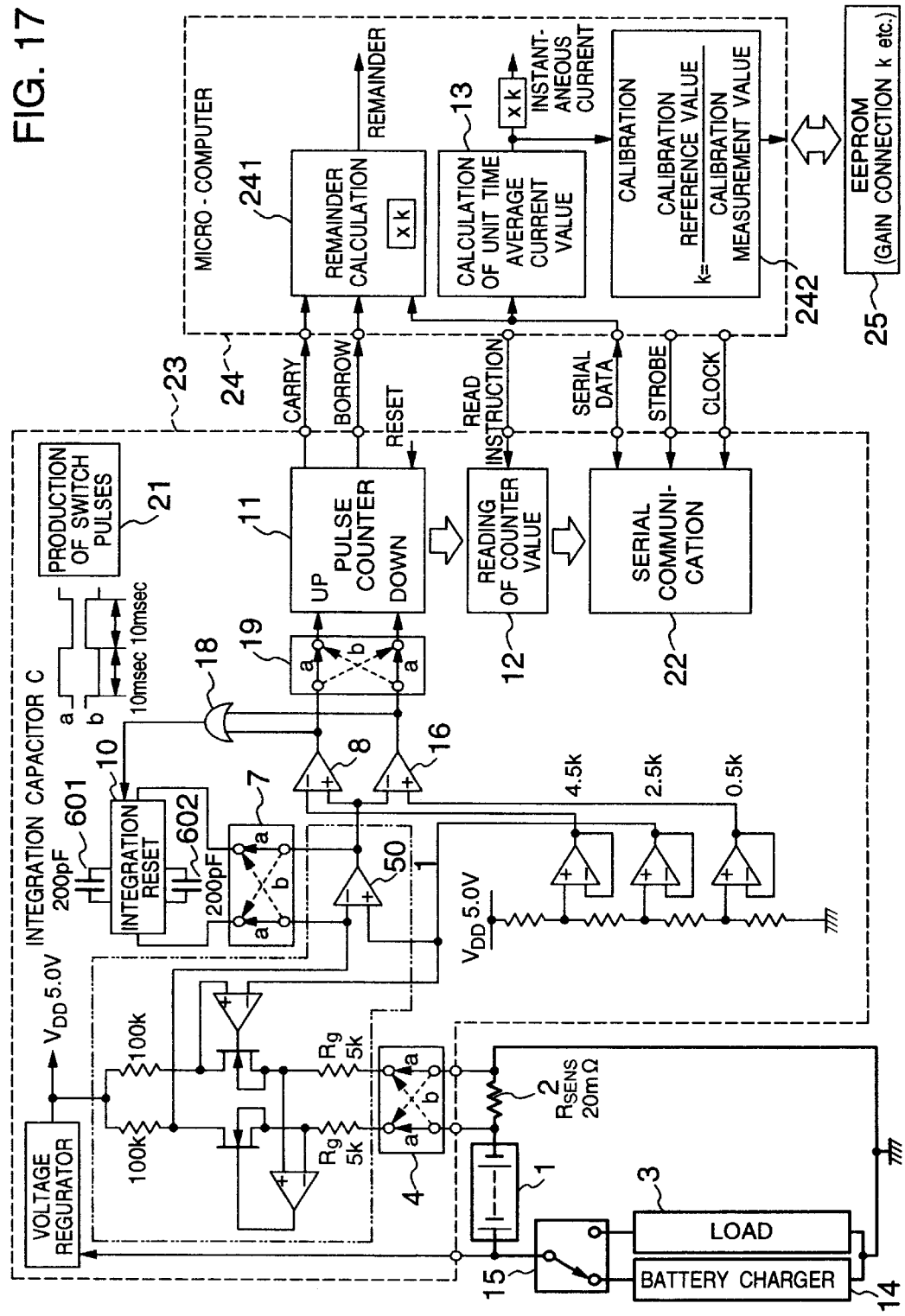
FIG. 17 is a block diagram, partly in circuit diagram, showing a configuration of a fourth embodiment of the present invention.

Next, a fourth embodiment of the present invention will hereinbelow be described with reference to FIG. 17. In FIG. 17, reference numeral 10 designates integration resetting means, and reference numerals 601 and 602 designate two integration capacitors, respectively. In this connection, the portion including the integration resetting means 10, and the two integration capacitors 601 and 602 is equal to each of the circuits which are shown in FIGS. 14 to 16 of the above-mentioned third embodiment. Reference numeral 21 designates switch pulse producing means, reference numeral 22 designates serial communication means, reference numeral 23 designates an IC for detecting the current accumulated value, reference numeral 24 designates a micro-computer, reference numeral 25 designates an EEPROM (an electrically erasable and programmable ROM), reference numeral 241 designates means for calculating the battery energy remainder, reference numeral 242 designates calibration means, and so forth. Other constituent elements are the same as those which were described in the first to third embodiment.

The load current (the discharging current) or the charging current of the battery is caused to flow through the loop which is illustrated in the lower left-hand corner in the figure with a heavy line and which is constituted by the battery 1, the current sensor resistor 2, the load 3 or the battery charger 14, and the charge/discharge switching unit 15.

The current sensor voltage which has been developed across the terminals of the current sensor resistor 2 is introduced into the integrator 5 through the input status selector 4. The circuit which is surrounded with a two-dot chain line in the figure is the integrator 5, and this integrator 5 is of the same type as that shown in FIG. 3C. The mutual conductance of this portion is determined on the basis of Rg=5 kΩ and hence is 0.2 ms (milli-siemens). The reference voltage of the operational amplifier 501 is 2.5V and the output voltage of the integrator in integration reset becomes 2.5V.

The first voltage comparator 8 and the second voltage comparator 16 have, as the threshold voltages for integration reset, the voltages of ±2V which are symmetric with respect to the reference voltage of 2.5V (i.e., 4.5V and 0.5V), respectively.

The input status selector 4, the connection-polarity inverter 7 of the integration capacitor and the up/down inverter 19 are controlled on the basis of pulses a and b which are illustrated in the figure and which are generated by the switch pulse generating means 21 and are synchronously switched.

The data from the pulse counter 11 is transmitted to the micro-computer 24 through the serial communication means 22 and the like so that the programs of the calculation of the battery energy remainder, the calculation of the unit time average current value, the calibration of the gain and the like are executed, thereby obtaining the respective calculation results. For the calibration of the gain, in the process of adjusting the circuit apparatus in which the present invention is implemented., the reference current for calibration is caused to flow through the current sensor resistor 2, and on the basis of the ratio of the calibration measurement value which is measured at this time as the unit time average current value to the calibration reference value, a correction factor k is obtained. This correction factor k is stored in the EEPROM 15, and in the actual operation, this value is read out to the microcomputer to correct the gain.

Figure 18:
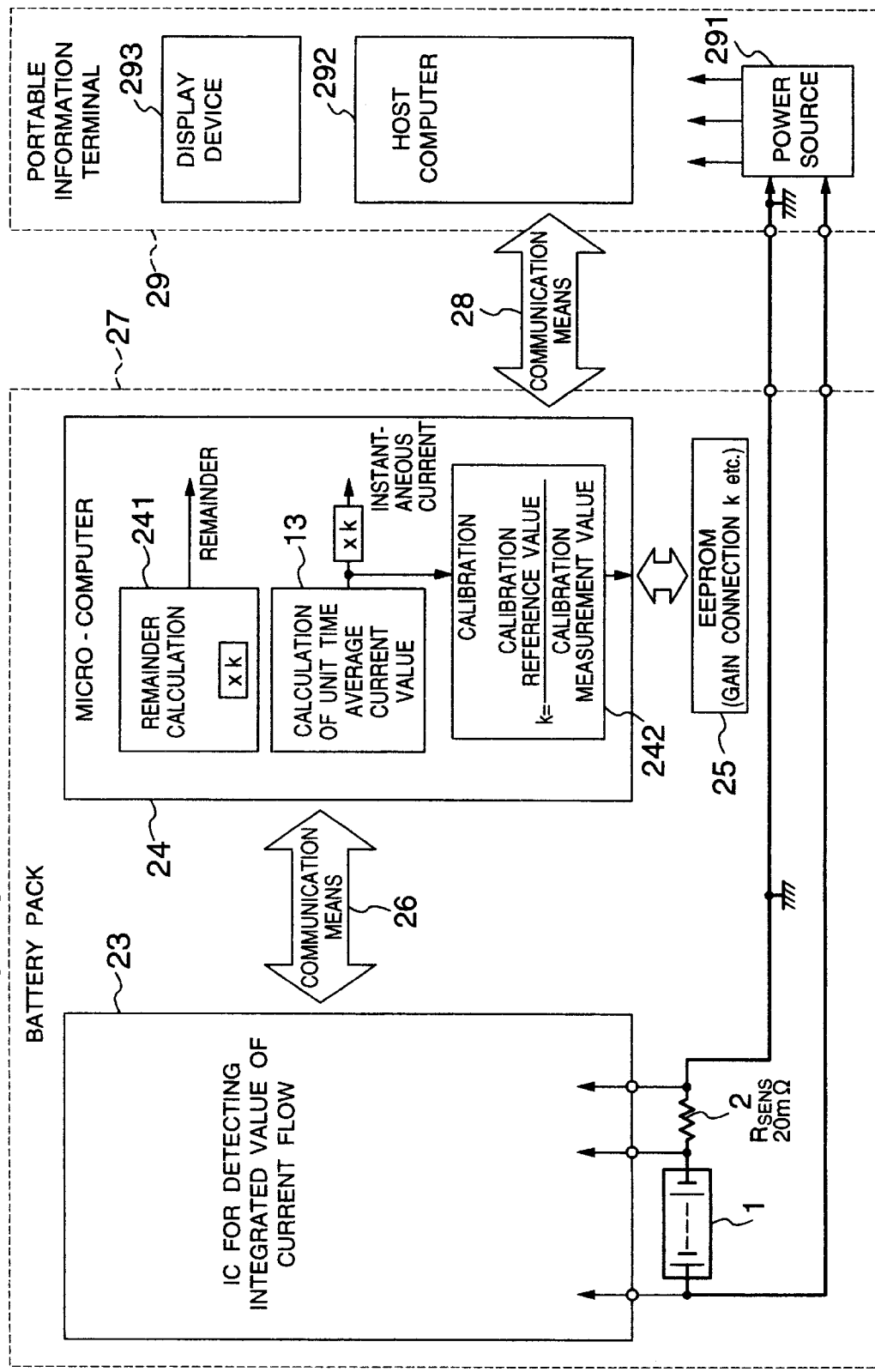
FIG. 18 is a block diagram, partly in circuit diagram, showing a configuration of a fifth embodiment of the present invention.

Next, a fifth embodiment of the present invention will hereinbelow be described with reference to FIG. 18. In FIG. 18, reference numeral 23 designates an IC for detecting the integrated value of current flow the contents of which are the same as those of the IC 23 shown in FIG. 17. Reference numeral 26 designates communication means through which the information is transmitted between the IC 23 for detecting the integrated value of battery current flow and the micro-computer 24. The battery 1, the current sensor resistor 2, the IC 23 for detecting the integrated value of current flow, the micro-computer 24 and the communication means 26 constitute the battery pack 27. Reference numeral 29 designates a portable information terminal such as a note type personal computer which includes therein a power source 291, a host computer 292, and a display device 293 Reference numeral 28 designates another communication means through which the information is transmitted between the battery pack 27 and the portable information terminal 29. The battery pack 27 is normally used with the battery pack 27 attached to the portable information terminal 29 The electric power of the battery 1 in the battery pack 27 is supplied to the power source of the portable information terminal 29 and then is converted into the several kinds of necessary power source voltages in the portable information terminal to be supplied to the associated portions. The integrated value of battery current flow is detected in the IC for detecting the integrated value of current flow, and the data relating to the integrated value of current flow which is obtained by converting the integration value into the pulse count value is set to the micro-computer 24 through the communication means 26. In the micro-computer, the battery energy remainder and the unit time average current value are calculated and then the data thus obtained is sent to the host computer through the communication means 28 in accordance with the request instruction issued from the host computer of the portable information terminal. By the operation of the host computer, the display device 293 displays thereon suitably the data relating to the battery energy remainder, the values of the current or electric power which is currently being consumed, and the like.

As set forth hereinabove, according to the present invention, there are provided: a current sensor resistor which is inserted in series with a current path of a battery; an integrator; an input status selector for introducing therethrough a voltage which is developed across terminals of the current sensor resistor into input terminals of the integrator; an integration capacitor connected to the integrator; and a connection-polarity inverter for the integration capacitor which is provided between the integrator and the integration capacitor and which serves to switch the connection-polarity of the integration capacitor, wherein the input status selector switches regularly, alternately two statuses of a status a and a status b, and in the status a, introduces the battery current sensor voltage which is developed across the terminals of the current sensor resistor into the integrator, while in the status b, inverts the polarity of the battery current sensor voltage developed across the terminals of the current sensor resistor to introduce the resultant voltage into the integrator, or supposes the status that the battery current value is zero, and in this supposititious status, introduces the voltage developed across the terminals of the current sensor resistor into the integrator.

The connection-polarity inverter for integration capacitor makes the alternate inversion synchronously with the status a and the status b of the input status selector to switch alternately the connection-polarity of the integration capacitor, and as a result the integrator time-integrates, during the time period of the status a, the current corresponding to the battery current together with the currents due to the undesirable offset to accumulate the resultant electric charges as the integration electric charges in the integration capacitor, and during the time period of the status b, time-integrates the current which is obtained by inverting the current corresponding to the battery current together with the current due to the undesirable offset, or time-integrates only the current due to the offset to accumulate the resultant electric charges as the integration electric charges in the integration capacitor. Therefore, with respect to the component of the current due to the above-mentioned offset, the integration electric charges of the status a and the integration electric charges of the status b are subtracted from each other so that the integration electric charges of the current due to the offset are perfectly canceled, and hence across the output terminals of the integrator, the time-integration value of the battery current which is not influenced by the offset at all, i.e., the voltage corresponding to the integrated value of current flow is developed. On the other hand, with respect to the component of the battery current, in the case where in the status b, both of the battery current sensor voltage developed across the input terminals of the integrator and the integration capacitor are inverted in polarity, the integration electric charges which are accumulated in the integration capacitor during the time period of the status b are added with the same polarity as that in the status a, while in the case where in the status b, the battery current sensor voltage developed across the input terminals of the integrator is made effectively zero, the integration electric charges of the battery current component during the time period of the status a are accumulated in the integration capacitor. Therefore, the voltage corresponding to only the battery current component which is not influenced by the offset error is developed across the output terminals of the integrator.

In addition, there are provided: two voltage comparators for outputting, when the output voltage of the integrator changing with transition of time has reached a first or second predetermined threshold voltage for integration reset located in the plus and minus voltages which are symmetric with respect to the output voltage, as the reference voltage, which is obtained by clearing the electric charges in the integration capacitor of the integrator, the voltage transition exhibiting that fact; and integration resetting means for clearing, when the voltage comparators have outputted the voltage transition, the integration electric charges in the integration capacitor to zero. Therefore, the integration of the current can be continued while maintaining the output voltage of the integrator in the predetermined voltage range. In addition, there is provided a pulse counter for up-counting or down-counting the pulses which are generated at the outputs of the two voltage comparators at the operation frequency of the integration resetting means. Therefore, by counting the number of pulses, the integrated value of the charging/discharging current of the battery over a long time period can be obtained in the form of the digital value. In addition, by measuring the number of pulses which are generated within a unit time (i.e., the frequency), the battery current value at that time can be obtained.

The invention may be embodied in other specific forms without departing from the spirit or essential characteristics thereof. The embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. An apparatus for detecting an integrated value of current flow, comprising:

an integrator including an integration capacitor, to which a current sensor voltage is inputted, for outputting an output voltage corresponding to an integrated value of said current sensor voltage;

a resetting circuit for clearing integration electric charges accumulated in said integration capacitor to reset said integrator when said output voltage has reached an upper threshold value or a lower threshold value;

a counter for counting the number of resets of said integrator in an upper direction or in a lower direction; and a connection-polarity inverting circuit for inverting a polarity of inputting of said current sensor voltage to said integrator, a polarity of connecting of said integration capacitor to said integrator and a counting direction of said counter, alternatively, at a regular time interval and synchronously;

wherein an integrated value of current flow is obtained on the basis of a count value of said counter.

2. An apparatus for detecting an integrated value of current flow, comprising:

an integrator including an integration capacitor, to which a current sensor voltage is inputted, for outputting an output voltage corresponding to an integrated value of said current sensor voltage;

a resetting circuit for clearing integration electric charges accumulated in said integration capacitor to reset said integrator when said output voltage has reached an upper threshold value or a lower threshold value;

a counter for counting the number of resets of said integrator in an upper direction or in a lower direction; and a connection-polarity inverting circuit for inverting a polarity of inputting of said current sensor voltage to said integrator and a polarity of connecting of said integration capacitor to said integrator, alternatively, at a regular time interval and synchronously;

wherein a counting direction of said counter is controlled on the basis of a combination of which of said upper and lower threshold values of said output voltage of said integrator has been reached and a status of the polarity of said connection-polarity inverting circuit; and wherein an integrated value of current flow is obtained on the basis of a count value of said counter.

3. An apparatus for detecting an integrated value of current flow, comprising:

a current sensor resistor inserted in series with a current path of a battery;

an integrator including an integration capacitor, to which a current sensor voltage detected by said current sensor resistor is inputted, for outputting an output voltage corresponding to an integrated value of said current sensor voltage;

a resetting circuit for clearing integration electric charges accumulated in said integration capacitor to reset said integrator when said output voltage has reached an upper threshold value or a lower threshold value;

a counter for counting the number of resets of said integrator in an upper direction or in a lower direction;

a connection-polarity inverting circuit for inverting a polarity of inputting of said current sensor voltage to said integrator and a polarity of connecting of said integration capacitor to said integrator, alternatively, at a regular time interval and synchronously;

a micro-computer;

a portable information terminal to which an electric power of said battery is supplied through said current sensor resistor; and communication means through which information is transmitted between said micro-computer and said portable information terminal;

wherein a counting direction of said counter is controlled on the basis of a combination of which of said upper and lower threshold values said output voltage of said integrator has been reached and a status of the polarity of said connection-polarity inverting circuit;

wherein said micro-computer reads out the count value of said counter to calculate a battery energy remainder value; and wherein said portable information terminal receives data relating to said battery energy remainder value calculated by said micro-computer through said communication means and effects display thereof.

4. An apparatus for detecting an integrated value of current flow, comprising:

a current sensor resistor inserted in series with current path of a battery;

an integrator including an integration capacitor, to which a current sensor voltage detected by said current sensor resistor is inputted, for outputting an output voltage corresponding to an integrated value of said current sensor voltage;

a resetting circuit for clearing integration electric charges accumulated in said integration capacitor to reset said integrator when said output voltage has reached an upper threshold value or a lower threshold value;

a counter for counting the number of resets of said integrator in an upper direction or in a lower direction;

a connection-polarity inverting circuit for inverting a polarity of inputting of said current sensor voltage to said integrator and a polarity of connecting of said integration capacitor to said integrator, alternatively, at a regular time interval and synchronously; and unit time average current value calculating means for calculating a unit time average current value on the basis of the count value of said counter;

wherein a counting direction of said counter is controlled on the basis of a combination of which of said upper and lower threshold values said output voltage of said integrator has been reached and a status of the polarity of said connection-polarity inverting circuit; and wherein said unit time average current value calculating means reads out the count values of said counter at predetermined time intervals and divides a difference between the last read count value and the newest read count value by the predetermine time interval, thereby calculating the unit time average current value.

5. A battery pack comprising:

a battery; and a unit for detecting a value of current flow of said battery or an integrated value of the current flow of said battery;

said unit comprising:

a current sensor resistor inserted in series with a current path of said battery;

an integrator including an integration capacitor, to which a current sensor voltage detected by said current sensor resistor is inputted, for outputting an output voltage corresponding to an integrated value of said current sensor voltage;

a resetting circuit for clearing integration electric charges accumulated in said integration capacitor to reset said integrator when said output voltage has reached an upper threshold value or a lower threshold value;

a counter for counting the number of resets of said integrator in an upper direction or in a lower direction;

a connection-polarity inverting circuit for inverting a polarity of inputting of said current sensor voltage to said integrator and a polarity of connecting of said integration capacitor to said integrator, alternatively, at a regular time interval and synchronously; and a micro-computer;

wherein a counting direction of said counter is controlled on the basis of a combination of which of said upper and lower threshold values said output voltage of said integrator has been reached and a status of the polarity of said connection-polarity inverting circuit; and wherein said micro-computer includes calculating means for reading out the count value of said counter to calculate a battery energy remainder value or a unit time average current value.

* * * * *